(12) United States Patent
Cohen et al.

(10) Patent No.: US 7,945,825 B2
(45) Date of Patent: May 17, 2011

(54) RECOVERY WHILE PROGRAMMING NON-VOLATILE MEMORY (NVM)

(75) Inventors: Itzic Cohen, Netanya (IL); Ori Tirosh, Kfar Saba (IL); Kobi Danon, Rishon Lezion (IL); Shmulik Hadas, Tel Aviv (IL)

(73) Assignee: Spansion Isreal, Ltd, Netanya (IL)

( * ) Notice: Subject to any disclaimer, the term of this patent is extended or adjusted under 35 U.S.C. 154(b) by 260 days.

(21) Appl. No.: 12/323,333

(22) Filed: Nov. 25, 2008

(65) Prior Publication Data

US 2009/0228739 A1 Sep. 10, 2009

Related U.S. Application Data

(60) Provisional application No. 60/989,933, filed on Nov. 25, 2007.

(51) Int. Cl.
G11C 29/00 (2006.01)
(52) U.S. Cl. ...................................................... 714/721
(58) Field of Classification Search .................... 714/721
See application file for complete search history.

(56) References Cited

U.S. PATENT DOCUMENTS

| 5,233,610 A * | 8/1993 | Nakayama et al. ........... 714/704 |
| 5,650,959 A | 7/1997 | Hayashi et al. |
| 5,768,192 A | 6/1998 | Eitan |
| 5,822,245 A | 10/1998 | Gupta et al. |
| 5,963,465 A | 10/1999 | Eitan |
| 6,011,725 A | 1/2000 | Eitan |
| 6,130,452 A | 10/2000 | Lu |
| 6,133,095 A | 10/2000 | Eitan et al. |
| 6,175,519 B1 | 1/2001 | Lu |
| 6,215,148 B1 | 4/2001 | Eitan |
| 6,233,180 B1 | 5/2001 | Eitan et al. |
| 6,285,574 B1 | 9/2001 | Eitan |
| 6,292,394 B1 | 9/2001 | Cohen et al. |
| 6,396,741 B1 | 5/2002 | Bloom et al. |
| 6,448,750 B1 | 9/2002 | Shor et al. |
| 6,477,084 B1 | 11/2002 | Eitan |
| 6,490,204 B2 | 12/2002 | Bloom et al. |
| 6,552,387 B1 | 4/2003 | Eitan |
| 6,633,496 B2 | 10/2003 | Maayan et al. |
| 6,636,440 B2 | 10/2003 | Maayan et al. |
| 6,643,181 B2 | 11/2003 | Sofer et al. |
| 6,649,972 B2 | 11/2003 | Eitan |
| 6,671,204 B2 | 12/2003 | Im |

(Continued)

FOREIGN PATENT DOCUMENTS

EP 1443521 8/2004

(Continued)

OTHER PUBLICATIONS

Flash Memory Trends & Perspectives, Geoffrey MacGillivray, Semiconductor Insights. 2006 Flash Memory Summit.

*Primary Examiner* — James C Kerveros
(74) *Attorney, Agent, or Firm* — Ettan Mehulal Law Group

(57) ABSTRACT

Disclosed are methods and circuits for performing recovery associated with programming of non-volatile memory (NVM) array cells. According to embodiments, there are provided methods and circuits for programming NVM cells, including: (1) erasing NVM array cells; (2) loading an SRAM with user data; (3) if programming is successful, then flipping bits in the SRAM; and (4) if programming is not successful, reading data back from the array to the SRAM.

12 Claims, 8 Drawing Sheets

U.S. PATENT DOCUMENTS

| | | |
|---|---|---|
| 6,707,719 B2 | 3/2004 | Shibata et al. |
| 6,917,543 B2 * | 7/2005 | Sato .................. 365/185.22 |
| 6,954,393 B2 | 10/2005 | Lusky et al. |
| 6,963,505 B2 | 11/2005 | Cohen |
| 6,963,509 B1 | 11/2005 | Ju |
| 6,967,896 B2 | 11/2005 | Eisen et al. |
| 6,992,932 B2 | 1/2006 | Cohen |
| 7,062,619 B2 | 6/2006 | Dvir et al. |
| 7,123,532 B2 | 10/2006 | Lusky et al. |
| 7,173,863 B2 | 2/2007 | Conley et al. |
| 7,362,620 B2 * | 4/2008 | Yano et al. .............. 365/189.05 |
| 2003/0016562 A1 | 1/2003 | Im |
| 2003/0117856 A1 | 6/2003 | Lee et al. |
| 2003/0174555 A1 | 9/2003 | Conley et al. |
| 2004/0153902 A1 * | 8/2004 | Machado et al. ............ 714/710 |
| 2008/0052564 A1 * | 2/2008 | Yim et al. .................... 714/699 |
| 2008/0151618 A1 * | 6/2008 | Sharon et al. ............ 365/185.02 |

FOREIGN PATENT DOCUMENTS

EP 1280161 1/2006

* cited by examiner

"Basic" Recovery Flow

Recovery with ED Mechanism

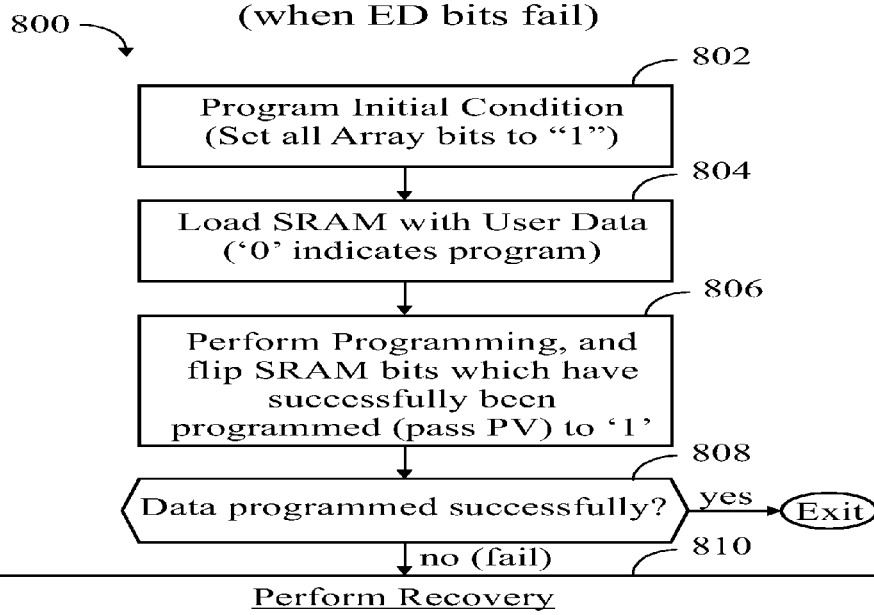

RECOVERY WHILE PROGRAMMING NON-VOLATILE MEMORY (NVM)

CROSS-REFERENCE(S) TO RELATED APPLICATION(S)

This application claims priority from U.S. Provisional Patent Application No. 60/989,933 filed Nov. 25, 2007.

TECHNICAL FIELD

The disclosure relates to techniques for operating semiconductor devices and, more particularly, to operating an array of non-volatile memory (NVM), such as floating gate (FG) devices or charge-trapping devices such as nitride read only memory (NROM), or other microelectronic cells or structures and, more particularly, to recovering data while programming.

BACKGROUND

Non-volatile memory (NVM) refers to semiconductor memory devices having a number of cells which are able to store data (typically in the form of binary bits), and retain that data even when the supply of electricity is removed from the device containing the NVM cells.

Flash memory is an example of non-volatile memory. Generally, data may be "programmed" into an array of NVM cells, and the array may be divided into blocks, pages, and other sub-divisions of the array. The data which is stored in the NVM array may subsequently be "read". Before programming new data in, for example, a block of NVM, all of the cells in the block are typically "erased".

An example of a volatile semiconductor memory device, which also has a number of cells which are able to store data (typically in the form of binary bits), but which loses its data when the power is removed, is static random access memory (SRAM). Generally, data may be "written" (rather than "programmed") to the cells of SRAM. (However, for NVM and SRAM, the terms "write" and "program" (and grammatical variations thereof) are often used, and may be used herein interchangeably.) The data which is stored in the SRAM may subsequently be "read".

Non-Volatile Memory Cells, Generally

In the main, hereinafter, nonvolatile memory (NVM) cells such as such as floating gate (FG) devices or charge-trapping devices such as nitride read only memory (NROM) may be discussed. Both of these NVM devices are similar to a field effect transistor (FET) which has source (S) and drain (D) diffusions in a semiconductor substrate, separated by a channel, and a gate element (G) disposed above the channel in the substrate and separated therefrom by a an insulating layer (gate oxide).

A floating gate (FG) device is similar to a field effect transistor (FET), but with a charge storage layer (floating gate) substituted for the gate oxide between the gate element and the underlying substrate. The charge storage layer may comprise a conductor, such as polysilicon, which is insulated from the gate element above and the substrate below by oxide. Charges in the charge storage layer are free to move around, since it is a conductor.

A nitride read only memory (NROM) is similar to a field effect transistor (FET), but with a charge trapping layer substituted for the gate oxide between the gate element and the substrate. The charge trapping layer may comprise a non-conductive, charge-trapping layer disposed between the gate element and the underlying substrate, such as a layer of nitride formed in an oxide-nitride-oxide (ONO) stack underneath the gate element.

Because the nitride layer in an NROM device is not a conductor, but rather "traps" charges, there may be two distinct charge-trapping areas in the nitride layer, one above each of the source and drain diffusions of the cell, and these may be referred to as the "left" and "right" charge storage areas, sometimes also referred to as left and right "bits" of the memory cell. These two charge storage areas may also be referred to as "half cells"—one NROM cell comprising two half cells which can independently be programmed and read.

Generally, there are three "modes of operation" for NVM cells: "program", "erase", and "read". "Program" may involve applying appropriate voltages to the terminals of the memory cell to cause injection of electrons into the charge storage layer of FG, or selected areas the charge trapping layer of NROM, such as by a process known as channel hot electron (CHE) injection. As the number of electrons increased, the threshold voltage (Vt) of the charge storage layer of FG or selected areas the charge trapping layer of NROM increases. Very generally, different threshold voltages (Vt's), or ranges thereof, may be associated with different "program levels". "Erase" may involve applying appropriate voltages to the terminals of the memory cell to cause F-N tunneling of electrons out of the charge storage layer of FG, or hot hole injection (HHI) of holes into selected areas the charge trapping layer of NROM. (Generally, "holes" are electrically opposite to electrons, and "cancel them out".) As electrons are removed or canceled out, the threshold voltage decreases. "Read" may involve applying appropriate voltages to the terminals of the memory cell, and based on subsequent current flow, ascertaining (measuring) the threshold voltage of the charge storage layer of FG, or selected areas the charge trapping layer of NROM.

Memory Array Architecture, Generally

Memory arrays are well known, and may comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

Generally, each memory cell comprises a first diffusion (functioning as source or drain), a second diffusion (functioning as drain or source) and a gate. Different voltages may be applied to each of the source, drain and gate to operate the memory cell. Generally, a first one of the diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 1A illustrates an array of NVM memory cells (labeled "a" through "i"), which may be of the NROM charge-trapping type, connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 1A are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f".

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell.

The bitlines (BLs) mentioned above may extend in parallel with one another, through the array (or a portion thereof). A single buried bitline (BB) may be a single diffusion shared by two adjacent cell transistors, and may be referred to herein as a diffusion bitline (DBL). The diffusion bitline (DBL) is a diffusion, functioning as a conductive line, which is physically disposed ("buried") within the surface of the substrate.

Programming Data, Generally

Programming data into a non-volatile memory (NVM) mass storage device (sometimes referred to as "writing") may comprise applying appropriate voltages to selected ones of the bitlines and wordlines, thereby injecting electrons into the charge storage or charge trapping layer of selected memory cells in an array to increase the threshold voltage (Vt) of the selected memory cells.

Generally, different threshold voltage levels are associated with and represent different data values. For example, when there are two "program levels", one program level may represent binary "0", and the other program level may represent binary "1".

Programming these bits typically comprises asserting one or more programming pulses, each increasing a given NVM cell's Vt by a small increment, followed by a verification phase in which the bits are read to determine (verify) whether the cells have been successfully programmed. Multiple cycles of program pulses followed by verify may be needed to complete programming all the bits.

Generally, programming is performed by first writing the data into a memory element such as a static random access memory (SRAM) device which may operate faster than NVM, then using the data in the SRAM to control programming of corresponding memory cells in the array of NVM cells. Generally, by caching the data to be written, controller (microprocessor) resources are freed up to work on other things.

FIG. 1B illustrates, in a very general manner, the concept that data is "buffered" in cache memory (such as SRAM) prior to being written to an NVM array (such as the NROM array shown in FIG. 1A) and when being read from the NVM array. The data may be in the form of a data stream which is accumulated by the SRAM into blocks, prior to writing to the NVM array. The SRAM may also serialize chunks of data which are read from the NVM array. The cache memory may be on the same chip as the NVM array.

Cache Operation

Cache programming generally refers to the practice of putting a cache memory before the memory array. Otherwise referred to as "pipelining", a page of data may be input to a cache register, then this data is transferred to a data register when a cache programming command is issued. When the transfer is complete, the cache register is available to receive new data input, while the data register simultaneously programs the memory array.

A normal cache programming operation requires two buffers, one working with the user and the other working with the array. The data to be programmed to the NVM array is loaded by the user (which may be a software application) and temporarily stored in a volatile data buffer such as SRAM array. After applying a programming pulse, the data read out from the NVM array is usually stored in a second volatile buffer, and program verification is carried out by comparing the data of the two buffers (the original data to be programmed and the temporarily read out data).

Cache programming may use a page-size cache register to program pages of data within a block. In the standard page program operation, the device has to finish programming the data into the memory array before a new page can be programmed. The advantage of the cache program operation is that it allows new data to be input while the previous data, that was transferred to the page buffer, is programmed into the memory array.

Program/Verify Cycle

Programming is typically performed in increments, with pulses of voltage—after each pulse, a verify operation occurs in which the threshold voltage level of the cell is measured (read). The general idea is to "nudge" the threshold voltage to the desired level, rather than over-shooting (over programming) or under-shooting (under programming) the desired level. With appropriate control mechanisms, only a few pulses (nudges) are required. A similar concept of cycles of pulse followed by verify until a desired Vt has been attained may sometimes be used during the erase operation, to avoid under-erase or over-erase. See, for example, commonly-owned U.S. Pat. Nos. 6,292,394; 6,396,741; 6,490,204; 6,552,387; 6,636,440; and 6,643,181.

On Reading the State of the Memory Cells

A memory cell may be programmed to different states, or program levels, determined by the threshold voltage (Vt) of the cell. For a single level cell (SLC), there are two program levels, generally "erase" and "program". For a multi-level cell (MLC) there are more than two program levels. An NVM cell's state may be defined and determined by its threshold voltage (Vt), the voltage at which the cell begins to conduct current. A NVM cell's threshold voltage level is usually correlated to the amount of charge stored in a charge storage layer or charge trapping region of the cell. Different threshold voltage ranges are associated with different states or program levels of an NVM cell.

Generally, in order to determine the state (program level) of an NVM cell, the cell's threshold level may be compared to that of a reference structure or cell whose threshold level is set, or otherwise known to be, at a voltage level associated with the specific state being tested for. Comparing the threshold voltage of a NVM cell to that of a reference cell is often accomplished using a sense amplifier or similar circuit. Various techniques for comparing an NVM cell's threshold voltage against those of one or more reference cells or structures, in order to determine the NVM cell's state, are well known.

When reading a NVM cell, to determine whether it is at a particular state, the cell's threshold voltage may be compared against that of a reference cell having a reference threshold voltage defined as a "read" level for the specific state. A "read" level is usually set lower than a program verify (PV) level and higher than the erase verify (EV) level in order to compensate for threshold voltage (Vt) drifts which may occur during operation.

In a "binary" or single level cell (SLC) capable of storing only one bit of information (a logic 1 or a logic 0), only a single read verify (RV) voltage is required, and it may be between the erase verify (EV) and program verify (PV) voltages for the cell.

"Read" is generally done by measuring the Vt of a cell (or half-cell), and associating the measured Vt with a program level (such as "0" or "1"). Although the Vt's of the cells are measured on an individual basis, it is generally necessary to determine a distribution of Vt's for many cells in order to associate the measured Vt of a given cell with a program level, with confidence. For example—if only one cell were to be read, and its threshold voltage were to be found to be at or very near the RV between two program levels, it may be difficult to say, with certainty, at which of two program levels the single cell was programmed, since its threshold voltage may have moved slightly upward or slightly downward since it was programmed. This is a benefit of reading bits one block at a time—to obtain a statistically meaningful sample of Vt's across a number of cells.

Threshold Voltage Drift

The threshold voltage of a NVM cell seldom stays fixed (after it is programmed, or erased). Threshold voltage drift is a phenomenon which may result in large variations of the threshold voltage of a memory cell. These variations may occur due to charge leakage from the cell's charge storage region, temperature changes, and due to interference from the operation of neighboring NVM cells.

The drift in threshold voltage of a memory cell is well known, and is discussed for example in commonly-owned U.S. Pat. Nos. 6,992,932 and 6,963,505 discloses read error detection in a NVM array, and may hereinafter be referred to as the "moving read reference" patent(s). These deviations in a cell's threshold voltage (Vt) may be either in the upward or downward direction, and may vary from cell to cell.

Variation of the threshold voltage of memory cells may lead to false reads of the cell's state and may further result in the corruption of the data in the memory array. Voltage drift is especially problematic in MLC cells (see FIG. 2B) where the Vt regions or sub-ranges associated with each programmed state are relatively smaller than those for a typical binary or SLC cell (see FIG. 2A).

It is known that, in order to reduce data loss and data corruption due to drift in the threshold voltages of the cells of a NVM array, threshold voltage drift of cells in the NVM array should be compensated for, during the read process.

The moving read reference patents disclose that, for a given NVM array, it is known to provide one or a set of reference cells whose references threshold voltages are offset from defined verify threshold levels by some value related to the actual threshold voltage drift experienced by the NVM cells to be read. There is a well understood need for an efficient and reliable method of determining a set of reference voltage levels which may accommodate variations in the threshold voltages of cells of an NVM array, and of established reference cells with the determined reference voltages.

On the Use of Reference Cells

Non-volatile memory (NVM) cells may have data bits stored therein that may be read, such as by means of a sense amplifier (SA). When reading a memory cell, a current flowing into the drain or out of the source may be measured, in order to determine the Vt of the charge storage area above the source (or, in the case of a floating gate memory cell, the Vt of the floating gate), and a voltage may be ascertained which corresponds to a program level.

Many NVM arrays employ a "reference cell" as the basis for comparing the output of an "array cell" for a read operation. Both of these cells—the reference cell and the array cell—are memory cells, such as flash cells, and may be substantially identical with one another, although they may be located in different portions of the overall memory array (and, of course, on the same integrated circuit (IC) chip). The use of a reference cell may help compensate for changes in the overall array, such as due to voltage variations and temperature, and ensure a fairly stable reference for read operations.

Reference cells are memory cells that are programmed to one or more predetermined levels related to reading the contents (program level, data bits stored in) of the array cells. See, for example, commonly-owned U.S. Pat. Nos. 7,123,532 and 6,954,393.

Using reference cells to determine the program level of an array cell being read is somewhat analogous to "color matching". For example, when a dentist is trying to determine a patient's tooth color, for manufacturing a prosthetic (false tooth), he may hold a card with reference colors (generally, all slightly different shades of white) up against the patient's tooth, comparing the reference colors to the patient's tooth color, looking for the best match. When holding a color sample against the patient's tooth, the dentist may determine that the tooth is either lighter than or darker than the color sample.

In the context of reading using reference cells, usually a value for Vt obtained from an array cell being read is compared against a "known" value from a reference cell and, using the sense amplifier (SA), it is determined whether the value read from the array cell is greater than the value retrieved from the reference cell. It is generally very important that the paths leading from the sense amps to the array cells are "matched" with the paths to the reference cells, and that they are operated in the same manner (for example, using the same drain drivers and Vds to read reference cells as are used to read the array cells.)

Adjusting/Shifting Read Reference Voltages/on the Use of ED Bits

Prior to or during the programming of a set of cells in a NVM array, the number of cells to be programmed to each of one or more logical or program states associated with the set of cells may be counted, and may be counted and stored, for example in a check sum table. The number of cells to be programmed to, up to and/or below each logical or program state may be counted and/or stored in the table which is either on the same array as the set of NVM cells or in memory on the same chip as the NVM array.

When reading the programmed array cells, the number of cells found to be at a given logical or program state may be compared against either corresponding values stored during programming (such as the number of cells programmed to a given state) or against a value derived from the values stored during programming (such as the number of cells programmed at or above the given state, minus the number of cells programmed to or above an adjacent higher logical state).

Generally, in the case of counting the number of cells programmed to a given state, the number stored is an error detection (ED) value, and the process of using this ED value (or stored ED bits) to correct a faulty read may be referred to as the "ED mechanism".

If there is a discrepancy between the number of cells read at a given state and an expected number based on the values determined/counted/stored during programming, a read voltage (RD, also referred to as Read Verify (RV) voltage) associated with the given program state may be adjusted upward or downward to compensate for the detected error. The read verify level of an adjacent logical state may also be moved upward or downward in order to compensate for detected read errors at a given state.

For example, if the number of cells found (read) in a given program state is below an expected value, either the Read Verify voltage associated with that given state may be reduced, or if there is found that the number of cells read above the given state exceeds an expected number, the Read Verify voltage associated with a logical state higher and adjacent to the given state may be raised. Conversely, if the number of cells found. (e.g. read) in a given program state is above expectations, either the Read Verify voltage/value associated with that given state may be increased, or if there is found that the number of cells read above the given state is below an expected number, the Read Verify voltage associated with a logical state higher and adjacent to the given state may be lowered. Thus, Read Verify voltages for a set of cells may be selected such that the number of cells found/read in each of the states associated with the set may be substantially equal to the a number either read from or derived from the values counted during programming of the set of cells, which values may have been stored in a check sum table.

The check sum table (or ED bits) may reside on the same chip as the set of NVM cells, and a controller may be adapted to perform the above mentioned error detection and Read Verify reference value adjustments. The check sum table may either be stored in the same NVM array as the set of NVM cells, or on some other memory cells residing on the same chip as the NVM array, for example in a register or buffer used by the controller during programming and/or reading. Specialized error coding and detection circuits may be included with a controller on the same chip and the NVM array to be operated.

During the reading of the cells from the programmed set of cells, either the controller or some other error detection circuit may compare the number of cells counted in each program state during reading with the correspond check sum values stored during or prior to programming. For example, if the number of cells found in a given program state exceed the value derived from the check sum values, the Read Verify voltage associated with that given program state may be raised or the Read Verify voltage associated with the adjacent higher state may be lowered. Conversely, if the number of cell's found in a given program state is below the expected number, either the read verify threshold value associated with the given program state may be lowered, or the read verify threshold value associated with the next higher adjacent state may be raised.

If the number of cells found (read) in a given program state is below an expected value, either the Read Verify reference voltage associated with that given state may be reduced, or if there is found that the number of cells read above the given state exceeds an expected number, the Read Verify reference associated with a logical state higher and adjacent to the given state may be raised. Conversely, if the number of cells found (e.g. read) in a given program state is above expectations, either the Read Verify voltage associated with that given state may be increased, or if there is found that the number of cells read above the given state is below an expected number, the Read Verify voltage associated with a logical state higher and adjacent to the given state may be lowered.

Thus, Read Verify reference voltages for a set of cells may be selected such that the number of cells found/read in each of the states associated with the set may be substantially equal to the a number either read from or derived from the values counted during programming of the set of cells, which values may have been stored in a check sum table.

The steps described hereinabove may be repeated as part of an iterative process until the number of cells read in each program state substantially corresponds to the number of cells expected in each state based on data recorded during programming. The process may start with the checking of cells programmed to the highest logical state, or cells programmed to several different states may be checked in parallel.

ED bits may be programmed into multi-level cells in a "high reliable" manner, to reduce problems associated with threshold voltage shift. For example, in memory cells having four accessible program levels, such as shown in FIG. 2B, the ED bits may be programmed using only two widely separated levels, such as "11" (the lowest threshold voltages) and "10" (the highest threshold voltage), so that there is a wide gap between the two threshold voltage distributions and the ED bits can reliably be read.

Operating Flash Memory

Flash is a non-volatile memory that can retain the data stored therein even after power is removed. NAND Flash (see Glossary below), which is one type of Flash, is a high-density design and has certain advantages over other types of memory, including a large storage capacity (such as one gigabits or more), good speed for continued access, and low cost. However, NAND Flash also has several inherent drawbacks, including poor performance for random access and increased susceptibility to bit errors over the NAND Flash's operating lifetime. In particular, NAND Flash is typically accessed in unit of pages, one page at a time, with each page being of a particular size (such as 512 bytes).

Because the structure of NAND Flash is not suitable for random access, program codes cannot be executed directly from the NAND Flash. Instead, Static Random Access Memory (SRAM) may be used as an intermediate storage for data and program codes that need to be accessed in a random manner by the processor. A memory architecture that incorporates both SRAM and NAND Flash may thus provide large storage capacity, reduced cost, and random access.

Conventionally, reading data from or writing data into NAND Flash requires excessive involvement and control by the processor. This can tie up the processor and prevents it from performing other functions, which can then result in overall performance degradation for the communication device. Moreover, since NAND Flash is more prone to bit errors, a mechanism is needed to ensure data integrity when loading data from or into the NAND Flash.

As described, for example, in commonly-owned U.S. Pat. No. 6,967,896, a user wishing to write data to a NVM array may typically write the data to a cache memory, such as but not limited to, a static random access memory (SRAM). The cache memory routes or "addresses" the data to the appropriate bits in the NVM array. The data may be written to the SRAM in a byte granularity.

Array Architecture (and Operation)

FIG. 1C is a diagram of a mass storage device 150 such as such as non-volatile memory (NVM) which may comprise at least one array 152 of NVM memory cells, such as FG or NROM cells. Compare, for example, commonly-owned U.S. Pat. No. 7,062,619, which discloses mass storage device architecture and operation.

An X-decoder (XDEC) 154 may select and drive word lines within the array. A decoding control unit (DEC) 156 and one or more data path units (DPU) 158 may be disposed peripheral to the Array 152.

The decoding control unit 156 may control data coding/decoding operations related to the transfer of information to and from the NVM cells in the Array 152, such as but not limited to, selecting blocks or physical sectors, transfer of voltages and currents, and control of some operations of the data path units 158, such as enabling different signal paths to and from the NVM array.

The data path unit 158 may comprise a YMUX (y-multiplexer) to select one or more bit lines of the Array 152. The data path unit 158 may further comprise driving units (not shown) that drive the bit-lines in different operational modes (such as read, program, erase), sensing circuitry to generate a logical signal out of the array signals, a redundancy multiplexer to support column redundancy, as well as other components.

The various elements Array 152, XDEC 154, DEC 156 and DPU 158 may be generally laid out, as shown, but it should be understood that this drawing is a schematic representation. The Array 152 will generally be much larger (physically, size-wise) than any of the XDEC 154, DEC 156 or DPU 158.

A data bus 160 may transfer data between the data path unit(s) 158 and a plurality of other units, such as but not limited to, a buffer interface unit (BIF, not shown), a redundancy unit (not shown), a built-in self-test unit (BIST, not shown). A controller 170 may interface with the data bus 160 via these other units (not shown). The data bus 160 may also transfer data back and forth to static random access memory (SRAM) 162. A user (another device) may input data and communicate with (control) the controller 170 via an input/output (I/O) unit 172.

In general, programming operations performed on the Array 152 may comprise writing data, which has been stored in a first portion of SRAM 162, to bits in array 152.

A user may choose to program bits of the Array 152 by application of the necessary word line and bit line voltages. However, it may be advantageous before applying these voltages to verify if the bits have already reached a programmed state. If a bit is already programmed, then application of the programming voltages may be a waste of time and power, and may detrimentally affect the reliability of the memory cells. Accordingly, prior to programming, the state of a particular bit may be pre-verified to detect whether the bit is in a programmed state or not.

Consider the example of "0" representing an erase state, and "1" representing a program state. First, all the bits in the Array are erased. Then, based on the User Data in the SRAM, the SRAM bits which are '0' are programmed into corresponding bits in the Array. When it is verified that an Array bit has reached its programmed state, the SRAM bit can be changed to '1', to stop programming of the corresponding Array bit. Generally, during programming once all the bits of SRAM 162 are '1', it is a sign that all of the bits of the array 152 which should be programmed are programmed, and no further programming is required.

After or while writing data to the Array 152, the operation may fail to reach completion, for whatever reason. As a result, the data SRAM may contain 0's, but not necessarily as in the original data (some of the 1's in the data SRAM may correspond to bits that completed their programming prior the operation failure).

Single-Level and Multi-Level Programming

In early NVM memory cells, there were generally only two program levels (or states), which represented binary "0" and binary "1", and this is referred to as "single level programming" (SLC). Generally, the program level is determined by the threshold voltage created by electrons (or holes) stored in the floating gate (of an FG cell) or in the charge-trapping medium (such as nitride layer, in NROM). For example, a binary "0" may have been represented by a threshold voltage (Vt) less than 4.0 volts, and a binary "1" may have been represented by a threshold voltage greater than 4.0 volts.

FIG. 2A is a graph illustrating two states of a "binary" or single level cell (SLC) capable of storing one bit of information per cell (or per charge trapping area with an NROM cell), and utilizes only one read verify threshold (RV). Generally, the two states are erased (represented by "1") and programmed (represented by "0"). The horizontal axis is threshold voltage (Vt), increasing from left to right.

Three voltage levels are illustrated in FIG. 2A, these are EV (erase verify), RV (read verify) and PV (program verify). As illustrated, EV is less than RV which is less than PV. A high Vt may represent a program state of binary "0", and a low Vt may represent an erase state of binary "1". The binary designations are arbitrary, and may be reversed (high Vt="1", low Vt="0").

FIG. 2A is generalized, and is applicable to a population (plurality) of memory cells (or half cells). The curves represent the threshold voltages (Vts) for a number of cells at the given program level. Typically, there is a distribution, or spread, about a nominal (or average, or center) value. For example, the center value for "1" equals approximately 3.5 volts
the center value for "0" equals approximately 6.0 volts
EV equals approximately 4.0 volts
RV equals approximately 4.5 volts
PV equals approximately 5.5 volts In modern NVM memory cells, four or more program levels are possible, representing for example, binary "00" (zero), binary "01" (one), binary "10" (two) and binary "11" (three). This (having more than two program levels) is referred to as "multi-level programming" (MLC), and exemplary threshold voltages representing these four program levels might be, for example:

the center value for "11" equals approximately 4.0 volts
the center value for "01" equals approximately 4.4 volts
the center value for "00" equals approximately 4.8 volts
the center value for "10" equals approximately 5.4 volts Thus, it is evident that multi-level programming is much more "sensitive" than single level programming and, when reading the contents of a memory cell, small changes in threshold voltage or differences in measured voltage can lead to erroneous results.

Two binary digits, or "places" can represent four numbers. A "normal" binary counting sequence would be 00, 01, 10, 11, corresponding to decimal 0,1,2,3. Since it is arbitrary, which program levels represent which digits, notice in FIG. 2B that the program levels appear to be out of sequence, starting with 11 (three), then 01 (one), then 00 (zero), then 10 (two). This sequence 11, 01, 11, 10 appears to be not only reversed (starting with the highest binary value "11"), but also out of order, and is illustrative of a Gray code which, is a binary numeral system where two successive values may differ in only one digit. (In the "normal" binary counting sequence, both digits change when going from 01 to 10.) There are technical reasons for this, and the sequence may be considered to be arbitrary for purposes of the descriptions set forth herein.

FIG. 2B illustrates a situation wherein there are four possible MLC program levels (or states) 11, 01, 00, 10 for each memory cell (or, in the case of NROM, for each storage area of the memory cell). As illustrated, the program level 11 has the lowest Vt, the program level 01 has a higher Vt, the program level 00 has a yet higher Vt, and the program level 10 has a yet higher Vt. The program level 11 may be erase (ERS), which for purposes of this discussion is considered to be a program level, although it is not generally regarded as such.

There are a number of memory cells (or storage areas NROM cells) being programmed, erased and read. In a given array, or on a given memory chip, there may be many millions of memory cells. Programming may typically be performed in blocks, of thousands of memory cells. The different blocks of memory cells are typically located at different logical positions within the array, and at different physical positions on the chip. During (or before) programming, a checksum indicative of the number of cells programmed to each level may be stored, in the block, in the array, on the chip, or external to the chip.

At each program level (and this is also true for the SLC cells or half cells of FIG. 2A), there is typically a distribution of threshold voltages, within a range (a statistical spread). In other words, for a given program level, the threshold voltage is not likely to be exactly a unique, precise voltage for all of the memory cells being programmed to that level. Initially, in the act of programming the cell, the voltage may be off a bit, for example as a result of the state of neighboring cells (or the other charge storage area in the same NROM cell). Or, as a result of previous program or erase operations on the same cell, or neighboring cells. Or, as a result of a variety of other factors. And, after programming, the threshold voltage of a cell may change, as a result of programming neighboring cells (or the other charge storage area in the same NROM cell), or a variety of other factors.

Therefore, the threshold voltage (Vt) for a given program level may be more than average in some cells, in others it may be less than average. Neerthless, in a properly functioning group of cells (such as a block, or an array), there should be a clear distribution of four distinct program levels, such as illustrated. And, the distributions of Vt for each of the program levels should be separated enough from one another so that read positions (RV voltage levels) can be established between adjacent distributions of threshold voltages, such as the following:

RV01 is between EV and PV01, or higher than the highest expected Vt for a cell at state "11" and lower than the lowest expected Vt for a cell at state "01";

RV00 is between PV01 and PV00, or higher than the highest expected Vt for a cell at state "01" and lower than the lowest expected Vt for a cell at state "00"; and RV 10 is between PV00 and PV10, or higher than the highest expected Vt for a cell at state "00" and lower than the lowest expected Vt for a cell at state "10".

For example,
the center value for "11" equals approximately 4.0 volts
the center value for "01" equals approximately 4.4 volts
the center value for "00" equals approximately 4.8 volts
the center value for "10" equals approximately 5.4 volts
EV equals approximately 4.0 volts
RV01 equals approximately 4.4 volts
PV01 equals approximately 4.8 volts
RV00 equals approximately 5.4 volts
PV00 equals approximately 5.6 volts
RV00 equals approximately 6.0 volts
PV10 equals approximately 6.3 volts Threshold Voltage Drift FIG. 2C illustrates a condition of a pollution of NVM cells, programmed with SLC, wherein some of the bits (cells) in the higher "0" distribution have dropped below the RD level. In such a case, these cells below RD will not be read as "0s", but rather will be inferred to be "1s". (Commonly, the erased cells, in this case the "1s" are not counted, but are "inferred" simply by subtracting the number of "0s" from the total number of "1s" and "0s".)

FIG. 2C illustrates how to "capture" the low Vt "0s". This generally involves simply moving the read reference (RD), to the left, now labeled RD' (prime), to "capture" the "0s" that have lost sufficient Vt to be below the initial RD value. (It may be assumed that the Vt of these cells is still above the "1" (erase) distribution.) This may be referred to as "moving read reference", and the concept is generally disclosed in the aforementioned commonly-owned U.S. Pat. Nos. 6,963,505 and 6,992,932.

Generally, the decision to move RD may be based on having counted the number of "0s" which were programmed, and storing that number as an error detection (ED) bits. The recovered (read from the array) data is counted and compared to the stored ED bits. When, for example, fewer "0s" are read than were stored, this may indicate using what may be referred to herein as the "ED mechanism" to shift the read reference (RD) to the left, to capurture the "missing" "0s".

Two-Phase Programming

A MLC programming algorithm may include 2 phases, which may generally be referred to as "Phase 1" and "Phase 2", each phase operating like a normal two bit programming algorithm. For example, in Phase 1, which may be considered to be a "rough" phase, user data may quickly be programmed, in a series of "rough" increments, to an initial level (Vi) which is below a target level (Vt). Once all the data is above the initial level (Vi), in the second phase (Phase 2), the same data may be programmed again (or "re-programmed") to the target levels (Vt's), which may be considered to be a "fine" phase. In Phase 2, some of the cells will already be at the target level from the Phase 1 programming, and may not need to be re-programmed. Because of the two phases, the programming operation may use two (2) buffers, and each of the two buffers may be implemented in SRAM. These 2 buffers are required on top of the cache programming functionality requirement for two buffers as well. See, for example, Flash Memory Trends & Perspectives, Geoffrey MacGillivray, Semiconductor Insights, 2006 (page 11, Toshiba Programming Algorithm. Two-phase scheme to reduce programming time), incorporated in its entirety by reference herein.

It may be appreciated that although everything could be done in a single (one) phase of fine increments, the two phase approach (rough increments followed by fine increments) can achieve the desired Vt's without overshooting more efficiently and more quickly.

Recovery of User Data

Generally, when programming user data to a NVM array, the user data may first be written to a buffer, such as an SRAM, a process which may proceed much more quickly and reliably than programming the Array. The SRAM initially contains a valid copy of the user data. Generally, each bit (address) of the SRAM corresponds to a bit (address) of the array.

Just as an example, to program one page of an NVM array may be performed in a number of steps (for example, in two-phase programming) and may take about 1 msec (millisecond, or thousandth of a second), and to write a comparable amount of SRAM may be performed in one step and may take about 5 μsec (microseconds, or millionths of seconds). (In this example, SRAM can be written approximately 200 times faster than NVM can be programmed.)

Programming the cells of an NVM array may proceed in steps, using a limited number of pulses to nudge the threshold voltages (Vt's) of the cells above a program verify (PV) value. During programming, the SRAM may be used to control the operation of programming corresponding NVM cells of the array. Generally, the contents of the SRAM may change as array cells become successfully programmed (some addresses/bits of the SRAM may be re-written). Hopefully, all of the NVM cells will be successfully programmed, at which point the contents of the SRAM can be flushed, and filled (written) with new user data for controlling the programming of other NVM cells.

Programming NVM array cells may not always be successful, and may need to be re-done. However, due to the nature of how programming the NVM array cells typically proceeds (with the SRAM being re-written during programming), the user data may be "lost" in the midst of the process. Consequently, the original user data needs to be "recovered", or "reconstructed". (Else, it would need to be re-supplied/re-inserted by the user.)

Additional Background Information

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750. See also commonly-owned U.S. Pat. No. 7,062,619.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan M. Rabaey, Anantha Chandrakasan and Borivoje Nikolic, $2^{nd}$ Edition, 2002 and materials presented at and through http://siliconnexus.com, "Design Considerations in Scaled SONOS Nonvolatile Memory Devices" found at:
http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at:
http://klabs.org/richcontent/MemoryContent/nvmt_symp/nvmts_2000/papers/adams_d.pdf, "Philips Research—Technologies—Embedded Nonvolatile Memories" found at:
http://www.research.philips.com/technologies/ics/nvmemories/index.html, and "Semiconductor Memory: Non-Volatile Memory (NVM)" found at:
http://www.ece.nus.edu.sg/stfpage/elezhucx/myweb/NVM.pdf, all of which are incorporated by reference herein in their entirety.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

algorithm In mathematics, computing, linguistics, and related disciplines, an algorithm is a definite list of well-defined instructions for completing a task; that given an initial state, will proceed through a well-defined series of successive states, eventually terminating in an end-state.

array memory cells may optionally be organized in an array of rows and columns, and may be connected to selected bit lines and word lines in the array.

The array may be organized into various logical sections containing pluralities of memory cells, such as blocks, pages and sectors. Some of these sections may be physically isolated and operated independently from one another.

A chip containing the array may physically be divided into various sections, which may be referred to as:

Array Area (AA)—memory cells, bit lines, word lines, contacts to bit lines and word lines Cell Area—portion of the Array Area which comprises memory cells Contact Area—a portion of the AA devoid of memory cells (and word lines) to allow for BL contacts.

Periphery Area—a portion of the memory chip, adjacent or surrounding the Array Area, comprising control circuitry, typically CMOS, for operating the Array binary system The binary numeral system, or base-2 number system, is a numeral system that represents numeric values using only two symbols, usually "0" and "1". Owing to its straightforward implementation in electronic circuitry, the binary system is used internally by virtually all modern computers. Many 1s and 0s can be strung together to represent larger numbers. Starting at the right is the "place" for "ones", and there can be either 0 or 1 one's. The next "place" to the left is for "twos", and there can be either 0 or 1 two's. The next "place" to the left is for "fours", and there can be either 0 or 1 fours. The next "place" to the left is for "eights", and there can be either 0 or 1 eights. This continues for as many places as desired, typically 4, 8, 16, 32 or 64 places. For example, 0000 represents zero (a "0" in all four places)

0001 represents one (a "1" in the ones place, and 0s in all of the other three places)

0010 represents two (a "1" in the twos place, and 0s in the other three places)

0011 represents three (a "1" in the ones place, plus a "1" in the twos place)

0100 represents four (a "1" in the fours place, and 0s in all of the other three places)

1000 represents eight (a "1" in the eights place, and 0s in all of the other three places)

1010 represents ten (a "1" in the ones place, plus a "1" in the twos place)

In binary notation, each "place" to the left of the first (ones) place has a possible value of either 0 or, if there is a "1" in the place, two times the value of the place immediately to the right. Hence, from right (least significant bit) to left (most significant bit), the places have a value of either 0 or 1, 2, 4, 8, 16, 32, 64, 128, and so forth.

Generally, counting in binary begins with "zero", rather than with "one", as we are accustomed to. For example, four items could be counted as follows: "zero" (00), "one" (01), "two" (10), "three" (11).

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit".

In some cases, the actual (physical) left and right charge storage areas of a NROM cell are conveniently referred to as the left "bit" and the right "bit", even though they may store more than one binary bit (with MLC, each storage area can store at least two binary bits). In yet other cases, addresses within a NVM Array, or in a temporary storage medium such as SRAM, may be referred to as "bits". The intended meaning of "bit" (mathematical or physical) should be apparent from the context in which it is used.

BL short for bit line. The bit line is a conductor connected to the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

cache In computer science, a cache is a collection of data duplicating original values stored elsewhere or computed earlier, where the original data is expensive to fetch (due to longer access time) or to compute, compared to the cost of reading the cache. In other words, a cache is a temporary storage area where, for example, frequently accessed data can be stored for rapid access. Once the data is stored in the cache, future use can be made by accessing the cached copy rather than re-fetching or recomputing the original data, so that the average access time is shorter.

cell the term "cell" may be used to describe anything, such as a NVM cell, that can store one unit of analog data. This includes FG memory cells, and non-FG memory cells, such as NROM. See half cell.

distribution overlap A number of cells programmed at a given program level may exhibit a distribution of threshold voltages. Usually, the distribution for one program level is separated from a distribution for another program level. However, due to threshold drift, one or both of the distributions may move towards the other, causing some of the threshold voltages to be the same. The region where the threshold voltages are the same for cells programmed at two different program levels is the distribution overlap.

disturb When applying a pulse to a specific bit by raising WL and/or BL voltages, neighboring bits located on the same WL and/or same BL might suffer from Vt shift that cause margin loss. The shift is called "disturb". Disturbs are a fault type where the content of a cell is unintentionally altered when operating on another cell. These faults have similar characteristics to coupling faults, however, they have special neighborhood requirements.

Disturb faults are generally caused by the presence of high/intermediate electric field stress on an insulating layer within the core memory cell. This electric field results in leakage current caused either by FN-tunneling, punchthrough, or channel hot electron injection. Whether a given mechanism is responsible for a particular disturb is a function of the operating conditions and the state of the investigated cell.

The IEEE Standard Definition and Characterization of Floating Gate Semiconductor Arrays disturb faults can be divided into the following:

Word-line erase disturb (WED): Exists when a cell under program (selected cell) causes another unprogrammed cell (unselected cell), sharing the same wordline, to be erased.

Word-line program disturb (WPD): Exists when a cell under program (selected cell) causes another unprogrammed cell (unselected cell), sharing the same wordline, to be programmed.

Bit-line erase disturb (BED): Exists when a cell under program (selected cell) causes another unprogrammed cell (unselected cell), sharing the same bit-line, to be erased.

Bit-line program disturb (BPD): Exists when a cell under program (selected cell) causes another unprogrammed cell (unselected cell), sharing the same bitline, to be programmed.

Read disturb (RD): During read operation, the bias conditions are the same as programming conditions (except for lower voltage magnitudes) and can result in the injection of electrons from drain to FG thus programming the selected cell. This known as soft program. In addition, unselected erased cells may become programmed and those that are programmed may become erased giving rise to what is known as gate read erase and channel read program respectively. Both of these disturbs that occurs on un-addressed cells are considered to be another form of read disturbs.

ECC short for error correcting code, or error control coding. An error-correcting code (ECC) is a code in which each data signal conforms to specific rules of construction so that departures from this construction in the received signal can generally be automatically detected and corrected. It is used in computer data storage, for example in dynamic RAM, and in data transmission, for example in dynamic RAM, and in data transmission.

Some codes can correct a certain number of bit errors and only detect further numbers of bit errors. Codes which can correct one error are termed single error correcting (SEC), and those which detect two are termed double error detecting (DED). Hamming codes can correct single-bit errors and detect double-bit errors—SEC-DED. More sophisticated codes correct and detect even more errors.

An error-correcting code which corrects all errors of up to n bits correctly is also an error-detecting code which can detect at least all errors of up to 2n bits.

Two main categories are convolutional codes and block codes. Examples of the latter are Hamming code, BCH code, Reed-Solomon code, Reed-Muller code, Binary Golay code, and low-density parity-check codes.

ED bits as used herein, ED bits are numbers which may be calculated for and stored along with data being programmed (stored), which are indicative of the number of cells (or half-cells) at any given program level. For example, 512 cells (or half cells) at program level "10". During a subsequent read operation, the ED bits may be retrieved along with the data which was stored, the number of cells at the given program levels are counted, and these counts are compared with the ED bits. If there is a mismatch, this indicates a read error, and an error correction scheme such as "moving read reference" can be implemented. See moving read reference.

EPROM short for erasable, programmable read only memory. EPROM is a memory cell in which information (data) can be erased and replaced with new information (data).

erase a method to erase data on a large set of bits in the array, such as by applying a voltage scheme that inject holes or remove electrons in the bit set. This method causes all bits to reach a low Vt level. See program and read.

Error Detection and Correction In computer science, telecommunication, and information theory, error detection and correction has great practical importance in maintaining data (information) integrity across noisy channels and less-than-reliable storage media. More particularly, Error detection is the ability to detect the presence of errors caused by noise or other impairments during transmission from the transmitter to the receiver.

Error correction is the additional ability to reconstruct the original, error-free data.

FC short for flash (memory) cell.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate (G), drain (D) and source (S).

FG short for floating gate. The floating-gate transistor is a kind of transistor that is commonly used for non-volatile storage such as flash, EPROM and EEPROM memory. Floating-gate transistors are almost always floating-gate MOSFETs. Floating-gate MOSFETs are useful because of their ability to store an electrical charge for extended periods of time even without a connection to a power supply.

Flash memory Flash memory is a form of non-volatile memory (EEPROM) that can be electrically erased and reprogrammed. Flash memory architecture allows multiple memory locations to be erased or written in one programming operation. Two common types of flash memory are NOR and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND flash, cells are connected in series, resembling a NAND gate, and preventing cells from being read and programmed individually: the cells connected in series must be read in series.

Some systems will use a combination of NOR and NAND memories, where a smaller NOR memory is used as software ROM and a larger NAND memory is partitioned with a file system for use as a random access storage area. NAND is best suited to flash devices requiring high capacity data storage. This type of flash architecture combines higher storage space with faster erase, write, and read capabilities over the execute in place advantage of the NOR architecture. See NAND, NOR.

Gray Code The reflected binary code, also known as Gray code after Frank Gray, is a binary numeral system where two successive values differ in only one digit. The reflected binary code was originally designed to prevent spurious output from electromechanical switches. Today, Gray codes are widely used to facilitate error correction in digital communications such as digital terrestrial television and some cable TV systems. An example of a two-bit Gray Code is 00, 01, 11, 10. (Notice that in natural binary counting, the sequence would be 00, 01, 10, 11, and in the step from 01 to 10, two bits (digits) are changed.) Another example of a two-bit Gray code would be 11, 10, 00, 01.

half cell "half cell" (or "half-cell") is a term which is sometimes used to refer to the two distinct charge storage areas (left and right "bits", or left and right "sides") of an NROM memory cell.

logical operators A logical connective, also called a truth-functional connective, logical operator or propositional operator, is a logical constant which represents a syntactic operation on a sentence, or the symbol for such an operation that corresponds to an operation on the logical values of those sentences. A logical connective serves to return (results in) a "true" or "false" value (such as binary "0" or binary "1") when applied to arguments (operators) also having true or false values. For example, some common logical operators are:

AND the AND operator results in a value of "true" only if both of the operands (A,B) has a value of "true". (in binary terms, if A="1" and B="1", then the result is "1". Otherwise, the result is "0".)

OR the OR operator results in a results in a value of "true" if one or the other, or both of the operands (A,B) has a value of "true". (in binary terms, if either one of A or B="1" and B="1", the result is "1". Otherwise, the result is "0".)

XOR short for exclusive "or". the XOR operator results in a value of "true" if and only if exactly one of the operands (A,B) has a value of "true". (in binary terms, if only one of A or B="1" and B="1", the result is "1". Otherwise, the result is "0".)

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

moving read reference as used herein, "moving read reference" refers to a technique, such as disclosed in U.S. Pat. Nos. 6,963,505 and 6,992,932 wherein reference voltages are determined to be used in reading cells programmed to a given program state. Generally, if an error is detected, such as by using error detection (ED) bits, the reference voltages may have to be adjusted until the error is resolved. See ED bits.

multiplexer In electronics, a multiplexer or mux is a device that performs multiplexing: it selects one of many analog or digital data sources and outputs that source into a single channel.

NAND NAND flash architecture memories are accessed much like block devices such as hard disks or memory cards. The pages are typically 512 or 2,048 or 4,096 bytes in size. Associated with each page are usually a few bytes (typically 12-16 bytes) that are used for storage of an error detection (ED) and correction checksum. The pages are typically arranged in blocks, such as 32 pages of 512 bytes, 64 pages of 2,048 bytes, or 64 pages of 4,096 bytes. With NAND architecture, programming may be performed on a page basis, but erasure can only be performed on a block basis.

Most NAND devices are shipped from the factory with some bad blocks which are typically identified and marked according to a specified bad block marking strategy. The first physical block (block 0) is always guaranteed to be readable and free from errors. Hence, all vital pointers for partitioning and bad block management for the device are located inside this block (typically a pointer to the bad block tables). If the device is used for booting a system, this block may contain the master boot record.

NOR Reading from NOR flash is similar to reading from random-access memory, provided the address and data bus are mapped correctly. Because of this, most microprocessors can use NOR flash memory as execute in place (XIP) memory, meaning that programs stored in NOR flash can be executed directly without the need to copy them into RAM. NOR flash chips lack intrinsic bad block management, so when a flash block is worn out, the software or device driver controlling the device must handle this, or the device will cease to work reliably.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.) NVM includes floating gate (FG) devices and NROM devices, as well a devices using optical, magnetic and phase change properties of materials.

ONO short for oxide-nitride-oxide. ONO is used as a charge storage insulator consisting of a sandwich of thermally insulating oxide, and charge-trapping nitride.

PAE short for program after erase. PAE is useful to avoid cells that experienced over-erase and significant Vt reduction, to become leaky and cause read errors to all cells sharing the same bitlines.

page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing.

PBE short for program before erase. PBE is useful to bring cells to a more-or-less uniform level prior to performing an erase operation. Particularly, if a cell has been erased a number of times, it may otherwise end up with a negative Vt, which is generally undesirable.

program a method to program a bit (or cell, or half cell) in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

program rate as used herein, "program rate" refers to the number of times that a memory cell (or half cell) is programmed to various program (or threshold voltage) levels, such as representing a binary "1" or "0".

program time refers to the duration of a single program pulse, or the duration of the whole program sequence algorithm to program a bit set.

programmed "programmed" generally means that the threshold voltage (Vt) of a cell is above a predetermined "program verify" level (Vth).

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

read a method to read the digital data stored in the array. The read operation is usually performed in "blocks" of several cells. See erase and program.

refresh a part of the program or erase algorithms that checks the status of bits and applies pulses to bits that may have lost some of their Vt due to reliability margin loss.

register In electronics, a register is a small amount of storage whose contents can be accessed more quickly than storage available elsewhere. Registers are normally measured by the number of bits they can hold, for example, an "8-bit register" or a "32-bit register". Registers are now usually implemented as a register file, but they have also been implemented using individual flip-flops.

retention Retention generally refers to the ability of a memory cell to retain charges inserted into the charge storage medium, such as a floating gate. The data retention of EPROM, EAROM, EEPROM, and Flash may be limited by charge leaking from the floating gates of the memory cell transistors. Leakage is exacerbated at high temperatures or in high-radiation environments.

ROM short for read-only memory.

SA short for sense amplifier (or "sense amp"). A sense amplifier is generally used in conjunction with memory arrays to amplify a voltage coming off of a bit line. There are many versions of sense amplifiers used in memory chips.

sector a part of the array, usually larger than a page, which usually contains a few pages. A minimum erase might include a sector. For example:

Erase Sector (ES): Group of cells that are erased by single erase command

Physical Sector (PS): Group of ES connected by single grid of Word Lines (WL) and Bit Lines (BL), sharing same set of drivers.

SLC short for single level cell. In the context of a floating gate (FG) memory cell, SLC means that one bit of information can be stored in the memory cell. In the context of an NROM memory cell, SLC means that at least two bits of information can be stored in the memory cell.

slice a portion of a memory array, such as a group of bitlines, that are connected to one sense amplifier (sense amp, "SA")

SONOS Si-Oxide-Nitride-Oxide-Si, another way to describe ONO with the Si underneath and the Poly gate on top.

SRAM short for static random access memory. SRAM is a type of semiconductor memory. The word "static" indicates that the memory retains its contents as long as power remains applied, unlike dynamic RAM (DRAM) that needs to be periodically refreshed (nevertheless, SRAM should not be confused with read-only memory and flash memory, since it is volatile memory and preserves data only while power is continuously applied). SRAM should not be confused with SDRAM, which stands for synchronous DRAM and is entirely different from SRAM, or with pseudostatic RAM (PSRAM), which is DRAM configured to function, to an extent, as SRAM.

verify a read operation after applying a program or erase pulse, that checks if the applied program or erase pulse moved the Vt to the target level (program-verify or erase-verify level)

word line or wordline, (WL). A conductor normally connected to the gate of a memory cell transistor. The wordline may serve as the gate electrode of several of the memory cells.

write a combined method usually involving first erasing a large set of bits, then programming new data into the bit set; the erase step is not required but it is customary. See erase and program.

BRIEF DESCRIPTION

Summary

This summary section of the patent application is intended to provide an overview of the subject matter disclosed herein, in a form lengthier than an "abstract", and should not be construed as limiting the invention to any features described in this summary section.

According to the disclosure, generally, improved techniques for programming NVM cells are disclosed. The techniques disclosed herein may be integrated with other techniques for programming NVM.

Generally, this disclosure relates to programming NVM, such as an array of FG or NROM cells. User data may be loaded (written) into a volatile storage medium such as SRAM for controlling the program operation. Bits (addresses) of the SRAM correspond to bits (addresses) in the Array. A portion, such as a block of NVM may be initially erased. Programming may proceed in a sequence of steps in order to raise the Vt's of selected NVM cells above a program verify (PV) value. As bits of the array are successfully programmed (their Vt passes, or exceeds PV), the bits of the SRAM are re-written (their value is "flipped"), to stop further programming of the successfully programmed Array bits. If the program operation fails, the original user data needs to be recovered (or restored, or reconstructed), since it may no longer be available in SRAM (and may not be available in the Array).

Generally, as used herein, "programming" (and grammatical variations thereof) may refer to storing data in the NVM cells, and "writing" (and grammatical variations thereof) may refer to storing data in the SRAM.

The disclosure deals with the following problem:
Program a page (of the array) and the program fails.
Recover the data by constructing the bits from the SRAM and the Array.
Bits that passed program will be above PV level
Bits that didn't passed program will stay at the SRAM
The problem is to recover bits that fail below the RD level (initial drop from the PV level)
The recovered data may be checked with an ED mechanism and, in case of fail, to shift the RD reference and to read again.

The techniques disclosed herein generally provide the ability to do recovery for a distribution (in SLC) or distributions (in MLC) that fails below the RD level after program. The data is recovered correctly by combining the data from the Array and the SRAM. Not using this mechanism can resolve the recovery flow with error for the bits that fail the RD level. The recovery may be done with ED data integrity check. The ED may be used to check if the data is correct or needs to be reread with new reference location. Another ECC mechanism can replace the ED mechanism to identify the error after the recovery. A combination of ED and ECC can also be used to identify the error after the recovery, For performing recovery with ED (and/or ECC), a second SRAM may be used, and retain a copy of contents of the first SRAM. There may already be a second SRAM in the system, which is normally used for cache programming. If there is no extra SRAM in the system (for example if a cache program is not used), a second SRAM can be used, and may be the size of an ED chunk rather than page-size (an ED chunk may be much smaller than page size).

According to an embodiment of the disclosure, a method of performing recovery in conjunction with programming an array of NVM cells comprises: erasing the array cells and loading a first SRAM with user data; when programming the cells, flip bits in the first SRAM which are successfully programmed; if programming is not successful, reading the failed data from the array, and if the first SRAM bits were not successfully programmed, do not change them, and writing other bits which were not programmed or which were successfully programmed from the array to the first SRAM. Before reading the failed data, contents of the first SRAM may be copied to a second SRAM; applying an ED mechanism, and if ED bits do not align with the data in the array, moving a read reference (RD), copying contents of the second SRAM to the first SRAM, and reading from the array again, until the data is successfully recovered.

According to an embodiment of the disclosure, a method of performing recovery in conjunction with programming a portion of an array of non-volatile memory (NVM) cells, wherein: at least a portion of each cell may be set to a first threshold voltage level and at least one second threshold voltage level, a read reference (RD) is associated with at least one of the threshold voltage levels, and user data to be programmed to the cells is first written to bits of a first volatile storage medium, and the bits represent a first binary number and at least one second binary numbers, the method comprises: setting an initial condition for the NVM cells which is representative of a selected one of the threshold voltage levels; programming the NVM cells based on the user data in the volatile storage medium; flipping the bits of the volatile storage medium as corresponding bits of NVM cells are successfully programmed to the second state; and if programming fails, performing recovery by performing the steps of: (a) reading data from the portion of the array; (b) if the first volatile storage medium bit comprises the second binary number, do not change it; and (c) if the first volatile storage medium bit comprises the first binary number, write to the first volatile storage medium from the array.

The selected one of the threshold voltage levels may represent an erase state. Also, The first threshold level may be an erase state. The portion of the array may comprise a page. The NVM cells may comprise NROM cells. The first volatile storage medium may comprise static random access memory (SRAM).

Error detection (ED) bits may be provided, associated with the user data; and prior to performing the step (a), copying data from the first volatile storage medium to a second volatile storage medium; and after performing the step (c), comparing a number of bits which are read from the array to an ED counter and, if not aligned, moving the read reference (RD), then copying data from the second volatile storage medium into the first volatile storage medium, and returning to the step (a) until data is successfully recovered, or a time out occurs. When copying the data from the first volatile storage medium to the second volatile storage medium, copying the ED bits into the second volatile storage medium. The second volatile storage medium may comprise a volatile storage medium used for cache programming. The second volatile storage medium may be smaller than the first volatile storage medium. The portion of the array may comprise a page; the first volatile storage medium may be page-size; a page may comprise several chunks; and the second volatile storage medium may be chunk size.

According to an embodiment of the disclosure, a method of performing recovery in conjunction with programming a portion of an array of non-volatile memory (NVM) cells, wherein user data to be programmed is first written to a volatile storage medium, the method comprises: flipping a state of bits in the volatile storage medium based on successfully programming corresponding bits in the portion of the array; and in case of failed programming of the NVM cells, reconstructing the user data based on a portion of the data in the non-volatile memory cells and a portion of the data in the volatile storage medium.

The portion of the array may comprise a page. The NVM cells may comprise NROM cells. The first volatile storage medium may comprise static random access memory (SRAM).

An error detection mechanism may be used to move a read reference (RD) for reading threshold voltages (Vt's) in the NVM cells. Error detection (ED) bits associated with the user data may be provided; prior to performing recovery, copying data in the first volatile storage medium to a second volatile storage medium; comparing a number of bits which are read from the array to the ED bits and, if not aligned, moving the read reference (RD), then copying data from the second volatile storage medium into the first volatile storage medium, and reading again from the array until data is successfully recovered, or a time out occurs. When copying the data from the first volatile storage medium to the second volatile storage medium, the ED bits may be copied into the second volatile storage medium. The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

FIG. 8 is a flowchart illustrating steps which may be involved in performing recovery in conjunction with programming, according to an embodiment of the disclosure.

DETAILED DESCRIPTION

Figure 1A:
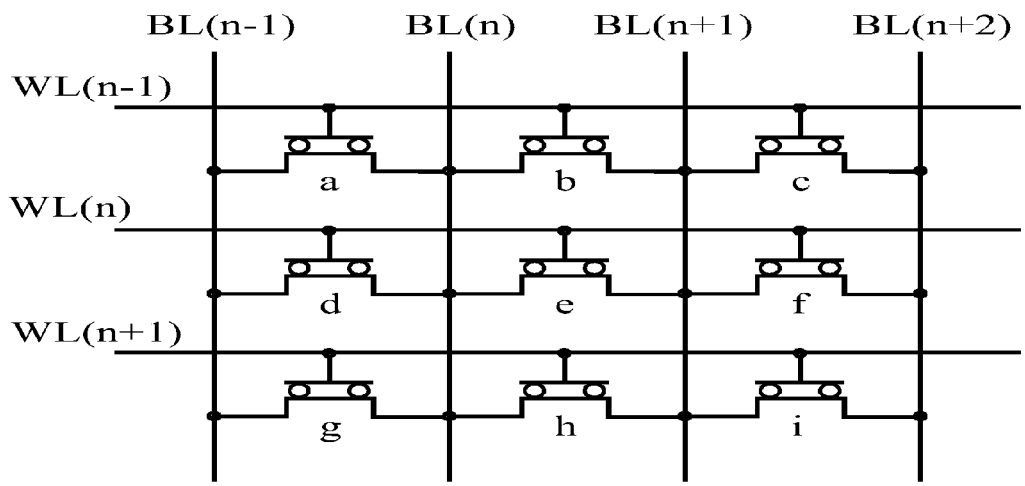
FIG. 1A is a diagram of an array of NVM cells, according to the prior art.
Figure 1B:
FIG. 1B is a diagram illustrating the use of cache memory in conjunction with an array of NVM cells, according to the prior art.

In the following description, various aspects of techniques for performing recovery in conjunction with (such as during) programming NVM cells will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O". Superscripts may be designated using a carat—for example, $2^{30}$ may be written as "2^30". When powers of 10 are involved, the following notation may be used—for example, "2e10" means $2 \times 10^{13}$.

Bit patterns may be designated either from left-to-right (such as "0 . . . 7"), or from right-to-left (such as "7 . . . 0"), both of these examples indicating bits "0" through "7".

Acronyms or abbreviations may be pluralized by adding an "s" at the end, either with or without an apostrophe—for example "Esecs" or "Esec's", both being a plural form of the singular "Esec".

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the in the description, as well as in the claims, should not be construed as limiting, but rather as illustrative.

Terms for indicating relative direction or location, such as "up" and "down", "top" and "bottom", and the like may also be used, without limitation. Sometimes, reference may be made to certain elements being to the "left" or to the "right", or "above" or "below" another element, without limitation.

The disclosure is generally directed to a technique for performing recovery (or restoration or reconstruction) of user data in conjunction with (during or after) programming non-volatile memory (NVM). As will be evident from the description that follows, from the user side the recover process may be transparent, and just something that happens during programming. Internally, the process proceeds in a manner somewhat like that of a read operation, particularly in cases where the Vt of bits of the Array have shifted Vt, requiring an ED mechanism to find them.

In a normal read, data is read from the Array and written to SRAM, and may be checked to determine whether ED bits (error detection bits) are aligned with the data which has been read and, if not, move the read reference and perform another read from the Array.

In the recovery (or restoration) technique described herein, data is read from both the array and the SRAM, performing an "AND" operation and writing to the SRAM.

The "recovery" procedure may use an "ED mechanism" such as "moving read reference" (MRR) and/or an error control coding (ECC), in the case of "program fail". "ED" refers to the use of error detection bits which may be stored along with data.

Geneally, the overall goal of the techniques disclosed herein is to recover (or restore, or reconstruct) "user data" after a non-successful program operation. In such a case the user data should be recovered into the internal buffer (which may be an SRAM), and may subsequently be used by the user. In order to recover the data, a read from the array is performed and the data is assumed reliable (passed a PV level) Data which did not pass the PV level is assumed to still be in the SRAM. In case the data in the array shifted below a read reference (RD) level the data cannot be recovered. The general idea is to overcome this problem and to recover the data in the case the data dropped below the RD. The moving read reference (MRR) technique may be used to shift the read reference (RD) and recover the data with reliability. Alternatively, a conventional error control coding (ECC) algorithm may be used to recover the data. Or, a combination of the MRR and ECC may be used to recover the data. The techniques disclosed herein may be useful for SLC and MLC products.

"Recovery", as used herein, generally refers to the ability to re-create (restore, reconstruct) the original data that the user initially tried to program, when the data is not fully represented in either the Array or in the SRAM. Recovery generally assembles valid pieces of the data from each of the Array and SRAM to reconstruct the original user data.

"Error Detection" (ED) bits, as used herein, may be bits (data) stored in the non-volatile memory (NVM), along with "User Data", to facilitate determining whether the stored data is accurate or has been corrupted.

"User Data", as used herein, generally refers to any data, from any source, that is intended to be appropriately encoded, then programmed into (or stored in) non-volatile memory (NVM). The intention is generally to later be able to accurately retrieve (read) the stored data. User data may be stored in the NVM using single-level coding (SLC) or multi-level coding (MLC) techniques.

"SLC", as used herein, generally refers to techniques for storing one bit of binary information, representing "0" or "1", in a given memory cell (or half cell). "MLC", as used herein, generally refers to techniques for storing more than one bit of binary information, such as "00", "01", "10", "11", in a given memory cell (or half cell).

"Moving Read Reference" (MRR), as used herein, generally refers to a technique where a read reference voltage (which may be referred to as "RD level") for reading the contents of a non-volatile memory cell (or half cell) is changed, usually in a lower direction, so that the contents of an NVM cell that have a lower threshold voltage than they ought to have can still be read at the desired program level. Implicit in MRR is knowing when and why to move the read reference, an example of which is referred to herein as the "ED mechanism" (or method, or technique), which uses an error detection (ED) value which is saved with the data and which may later be compared with the data, as read from the Array. The terms "ED mechanism" and "Moving Read Reference" may be used interchangeably herein.

"Error Correction (or correcting) Code" (ECC, also sometimes referring to "Error Control Coding"), as used herein, generally refers to a branch of information theory which helps to ensure error-free communication, over a communications channel or with a storage medium such as compact disc (CD) or non-volatile memory (NVM).

"Program Fail", as used herein, generally refers to a situation where a non-volatile memory cell (or half cell) is being programmed. This is typically done in pulses, increasing the cell's Vt in increments, each time checking whether the cell's Vt is above a "program verify" (PV) level (or value). If, after a few pulses, the cell's Vt fails to exceed the PV value, a "program fail" may be declared.

Figure 2A:
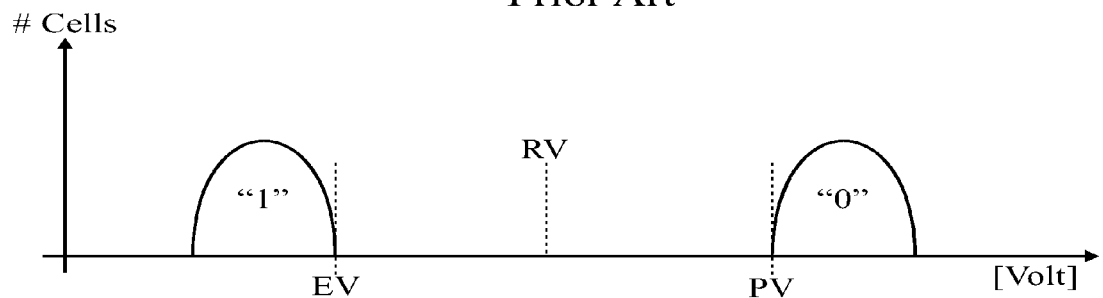
FIG. 2A is a diagram of threshold voltage (Vt) distributions of NVM cells in an array, at two different program levels, according to the prior art.
Figure 2B:
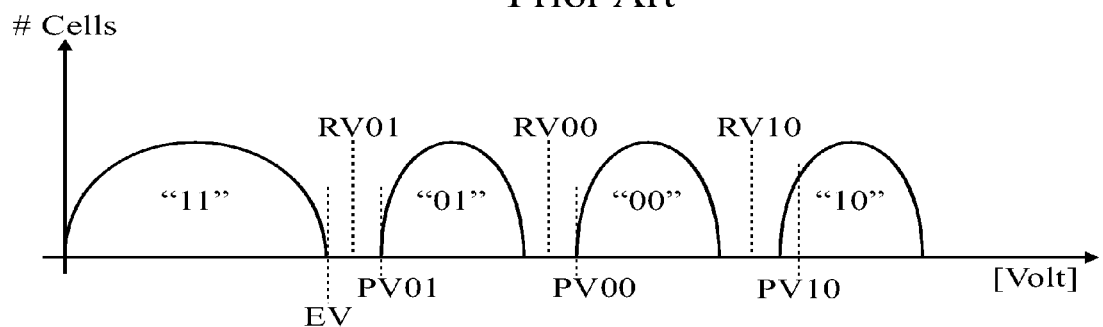
FIG. 2B is a diagram of threshold voltage (Vt) distributions of NVM cells in an array, at four different program levels, according to the prior art.

In the method of performing recovery in conjunction with programming at least a portion of an Array of non-volatile memory (NVM) cells described herein (such as with respect to FIGS. 6, 7 and 8), the portion of the Array, such as a page (or an erase sector), may initially be set to a uniform condition, such as the lowest of at least two program levels, or states. (In general, as used herein, the erase state is considered to be one of, such as the lowest of, the possible program levels). The at least two program levels may represent at least two corresponding binary numbers. For example, as shown in FIG. 2A, in the case of SLC, the erase state may correspond to binary "1", and there may be one state (corresponding to binary "0") other than the erase state. For example, as shown in FIG. 2B, in the case of MLC, the erase state may be representative of binary "11", and there may be several states (such as corresponding to "01", "00", "10") other than the erase state. See FIG. 2B. It is assumed that data to be programmed is first written to "bits" (addresses) a volatile storage medium such as SRAM, and the bits represent a first binary number and at least one second binary numbers. For example, in the case of SLC, an SRAM bit (address) may contain a binary '1' which corresponds with the program level "1" (erase) in the Array, or may contain a binary '0' which indicates that a corresponding Array cell (or half cell) needs to be programmed to program level "1". For example, in the case of MLC, an SRAM bit (address) may contain any of four (or more) binary numbers, such as "11", "01", "00", "10".

Performing "Basic" Recovery Flow

The following describes the a process of programming, with recovery of bits that were not successfully programmed, without needing ED and/or ECC. Generally, the following steps may be performed, during a programming operation: See flowchart of FIG. 6, which illustrates the "Basic" Recovery flow 600.

Figure 1C:
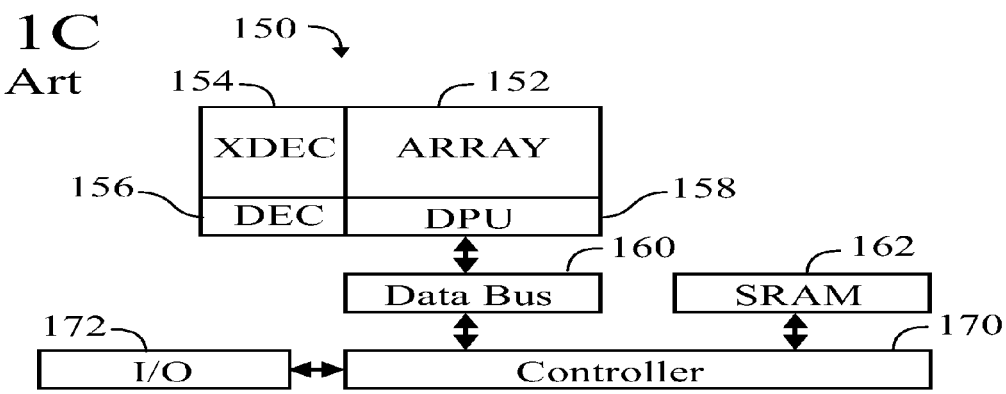
FIG. 1C is a diagram illustrating controlling the operation of an array of NVM cells, according to the prior art.

Step 1. An SRAM holds (is loaded with) the user data to be programmed. Bits which need to be programmed may be marked with '0' in the SRAM. A relevant portion of the array, such as an erase sector or block, is initially all erased (all bits are "1"). Bits which need not be programmed may be marked with '1' in the SRAM. See, for example, SRAM 162 in FIG. 1C. See steps 602 and 604 in FIG. 6.

Step 2. The user data is programmed from the SRAM to the Array. Bits which are successfully programmed (passed PV level in the Array) are changed to (marked as) '1' in the SRAM. See step 606 in FIG. 6.

Note, in Step 2, some of the SRAM bits are originally '1', indicating "do not program". After a '0' SRAM bit is successfully programmed, its value is "flipped" to a '1', which will indicate "stop programming" (which is analogous to "do not program"). A flipped SRAM bit is a successfully programmed bit, but is now indistinguishable from an SRAM bit which did not require programming in the first place. Thus, during (and after) programming, in the SRAM, '1' becomes ambiguous.

Step 3. If programming is successful, exit. See step 608 in FIG. 6. In case the program operation fails, the SRAM holds all the "failed" bits (bits that didn't pass the PV level in the Array), these bits remain marked as '0' in the SRAM. (Program fail can be inferred from the fact that there is at least one '0' in the SRAM, at the end of programming, or at the end of a timeout.)

Step 4. Recovery flow is performed: See step 610 in FIG. 6.
   a. The failed data (such as an entire page of data) are read from the Array. (Here an assumption is made that although a '0' bit didn't pass PV when being programmed into the Array, the resulting Array bit nevertheless has a Vt which is above RD, and can thus be read from the Array as "0".) Even though only some of the bits failed, all of the data which was being programmed is read from the Array. (Generally, when reading, it is not practical to read only selected ones of the bits, for example the failed bits, but rather the common practice is to read all of the data from the Array.)

b. In case the bit in the SRAM is '0' don't change it. (These '0' bits are accurate representations of the original user data.)

c. In case the bit in the SRAM is '1', read the data from the Array and write it into the SRAM. (This will change some of the '1s' in the SRAM, flipping them back to their original '0' status.)

Figure 6:
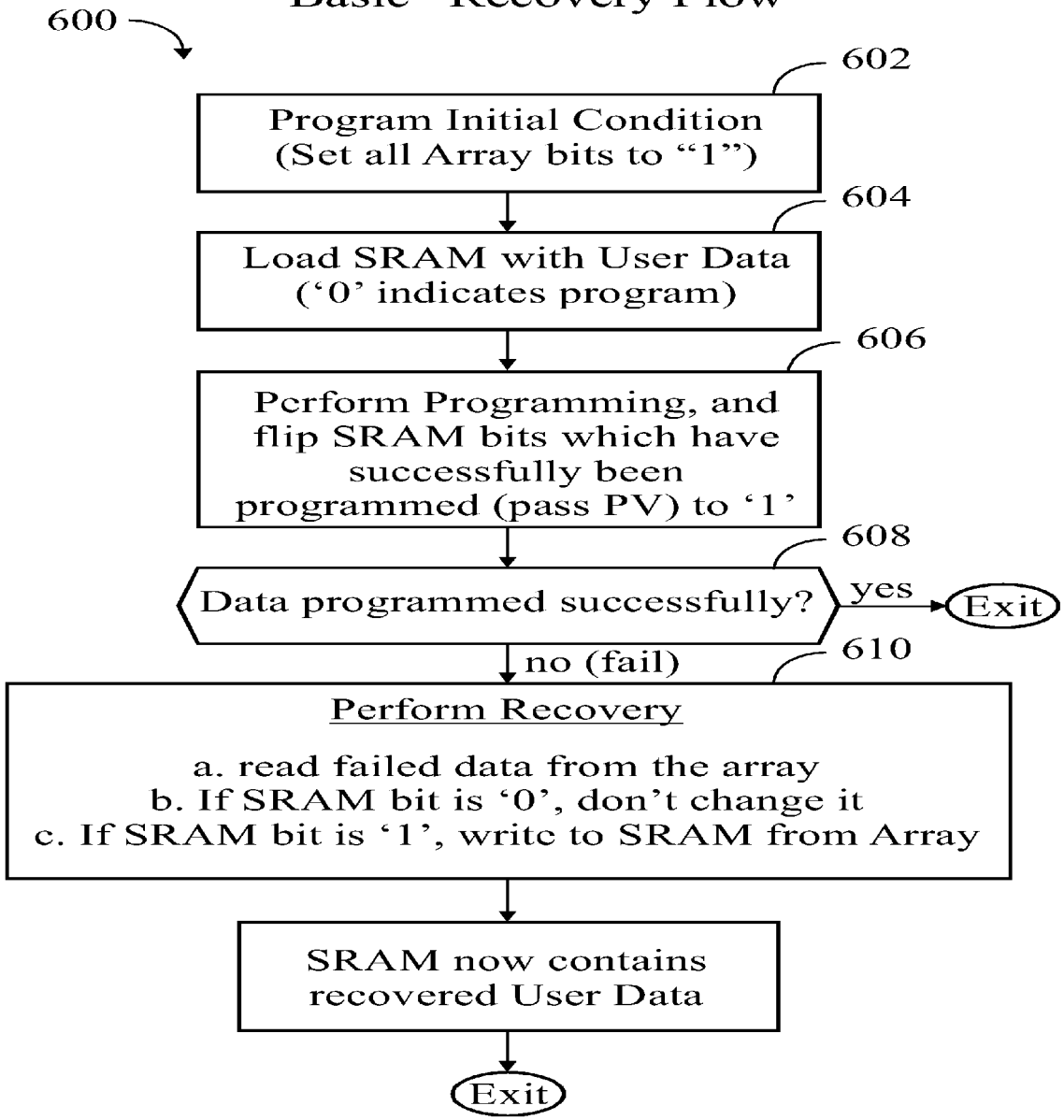
FIG. 6 is a flowchart illustrating steps which may be involved in performing recovery in conjunction with programming, according to an embodiment of the disclosure.
Figure 7:
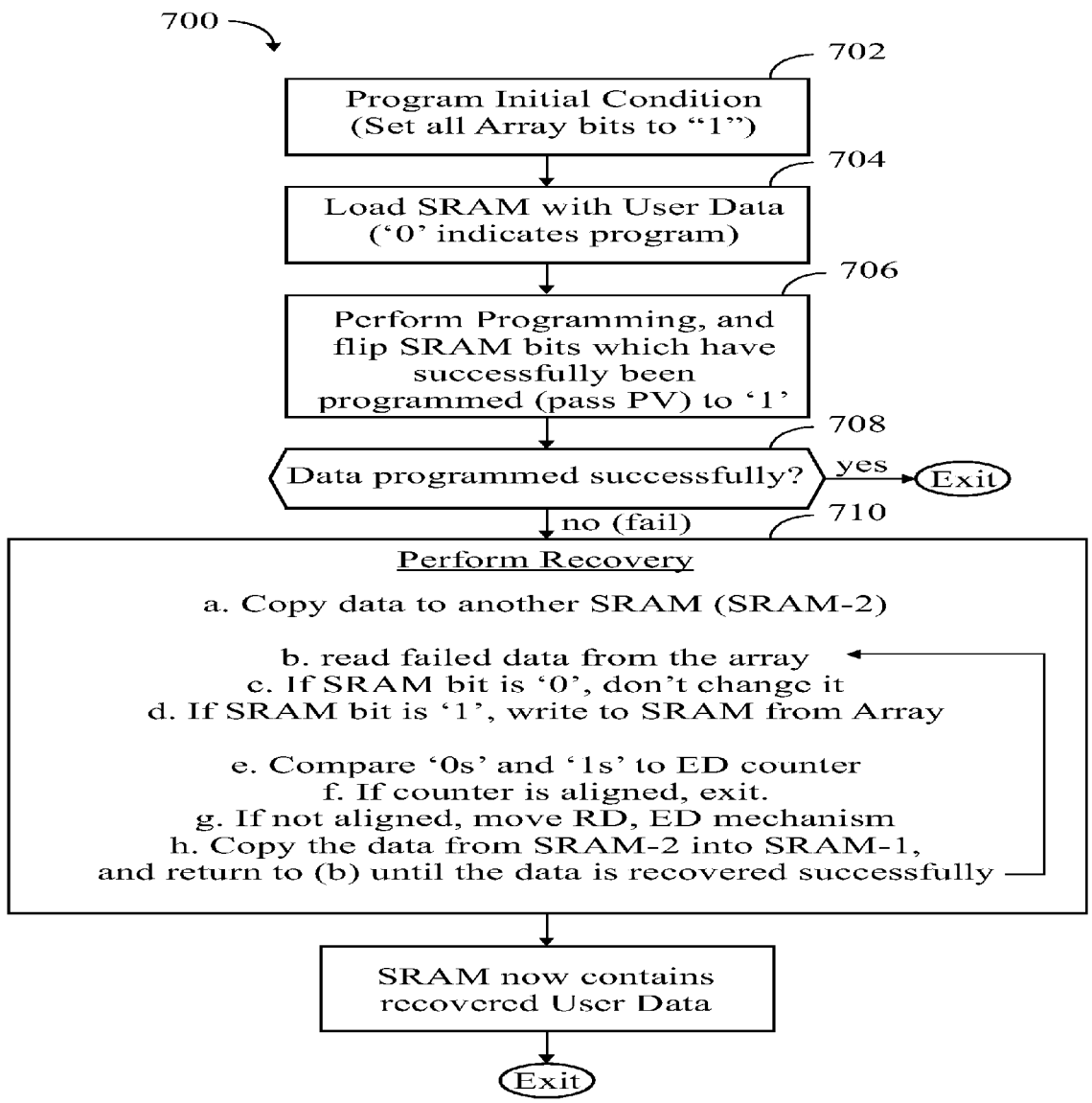
FIG. 7 is a flowchart illustrating steps which may be involved in performing recovery in conjunction with programming, according to an embodiment of the disclosure.

Step 5. The SRAM now has (is filled with) "recovered" User Data. This recovered data can be programmed to another Array page or location, or the user may do other things with the recovered data. (This is not a "step" (a step implying, "do something"), it is more of a "result", and is shown in FIG. 6.)

An Example of Performing "Basic" Recovery Flow

Figure 3A:
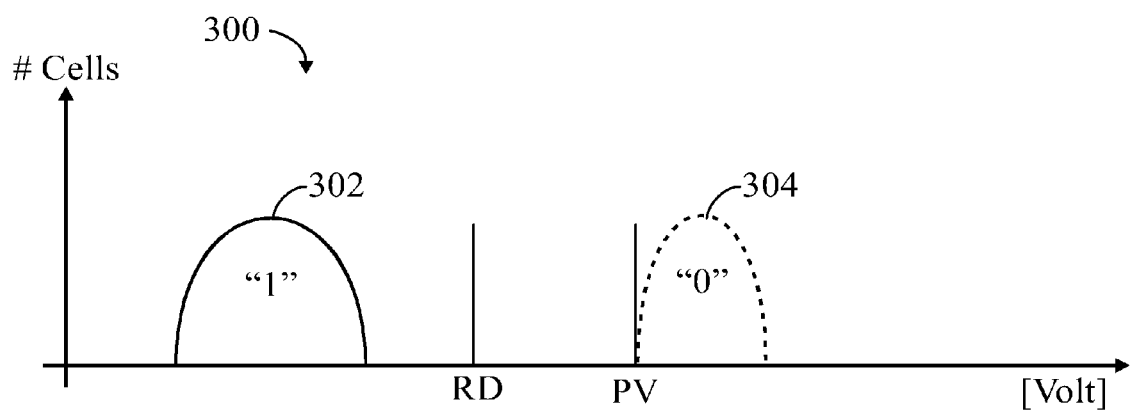
FIG. 3A is a diagram of threshold voltage (Vt) distributions of NVM cells in an array, illustrating the principle of "moving read reference", according to the disclosure.
Figure 3B:
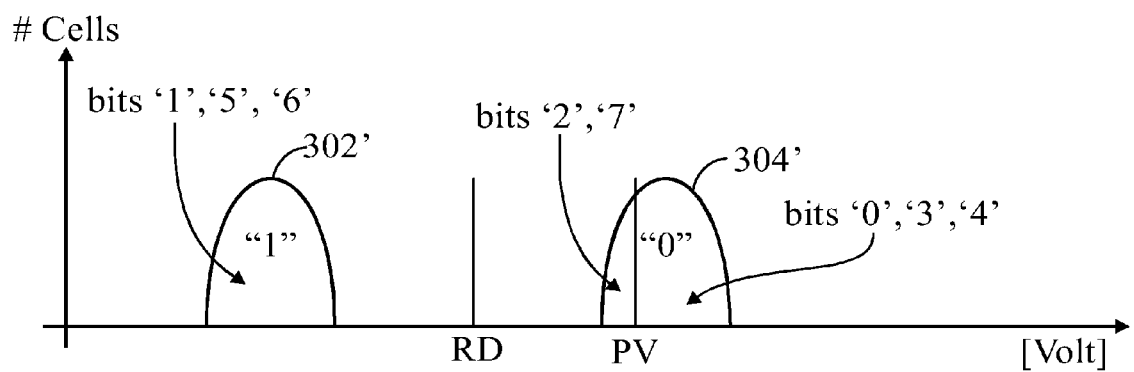
FIG. 3B is a diagram of threshold voltage (Vt) distributions of NVM cells in an array, illustrating the principle of "moving read reference", according to the disclosure.

Reference will be made to FIGS. 3A and 3B, and TABLEs 1, 2, 3 below. The figures illustrate distributions of Vt for cells (or half cells) in the NVM Array (such as FG or NROM cells), and the tables illustrate the contents of a volatile storage medium, such as n SRAM, used in conjunction with programming the cells (or half cells) of the NVM array.

This example is in the context of SLC (single level), where a given NVM cell (or half cell or an NROM cell) stores one of two binary values (such as "0" and "1"). In this example, the program level "1" is a low threshold voltage deemed to be the "erase" state, and the program level "0" is at a higher threshold voltage.

FIG. 3A illustrates a distribution 302 for a number of memory cells (such as a block of memory cells) in an Array at program level "1", which is deemed to be "erase". (Often, prior to programming, all of the cells in a given block are erased.) The number of cells is not particularly important, it is "many". This may be referred to a "program initial condition". More particularly, the number of memory cells being used in this example are the total population of memory cells within a given erase sector (or block) of an overall memory Array.

For example, an overall Array may have billions of bytes (gigabytes), and may be divided into several erase sectors (or blocks) each having 128 thousand bytes (128 KB), and each erase sector may be divided into several pages each having 2 thousand bytes (2 KB), and each page may be divided into several chunks each having 256 bytes.

Although, initially, all of the cells are erased ("1"), and there are no cells at program level "0", an "ideal" distribution 304 for cells at program level "0" is illustrated, in dashed lines, representing a target range of Vts for the cells (or half cells).

There is a "gap" between the distribution 302 and the distribution 304—in other words, between the highest Vt value in the lower distribution 302 and the lowest Vt value in the higher distribution 304.

A read value (RD) voltage is shown in the "gap", to the right of the distribution 302 and to the left of the distribution 304. The RD voltage is higher than any of the cells' erased threshold voltages. The threshold voltages of the cells in distribution 304 are (as shown) higher than the RD voltage.

A program verify (PV) voltage is shown to the right of the RD voltage, just at the lower edge of the higher distribution 304. During programming, the threshold voltages of cells programmed to program level "0" are intended to be increased sufficiently that they are all higher than PV, and are shown in this figure as all being higher than PV. This would be the result of a 100% successful program operation.

The following table (TABLE 1) illustrates the contents of a volatile storage medium, such as SRAM (such as 162, FIG. 1C), having eight addresses (0 . . . 7) for holding (storing/buffering) eight binary values which are either binary "1" or binary "0". Each SRAM address may be referred to as a "bit"—for example, the SRAM has bits 0 through 7.

The SRAM is loaded with User Data. (The user data is written to SRAM.) This example shows eight SRAM bits (addresses) loaded with eight bits (binary) of User Data. The SRAM essentially serves as a "template" for programming a number (eight, for example) of Array memory cells.

The SRAM bits 1, 5 and 6 are shown storing binary value '1'—these bits correspond to Array memory cells that will remain erased. (Since the Array cells corresponding to these bits are already at "1", the initial condition being erased, nothing needs to be done with these Array cells during programming.)

The SRAM bits 0, 2, 3, 4 and 7 are shown storing binary value '0'—these bits correspond to Array memory cells that will be programmed, to have a Vt above PV.

TABLE 1

| SRAM, with User Data | | | | | | | | |
|---|---|---|---|---|---|---|---|---|
| Address | 7 | 6 | 5 | 4 | 3 | 2 | 1 | 0 |
| Content | '0' | '1' | '1' | '0' | '0' | '0' | '1' | '0' |

Knowing (for example, from the above) that five SRAM bits contain binary "0", and therefore corresponding five memory locations in the Array are supposed to contain binary "0", an error detection (ED) bit (or bits) can be generated and stored (at another location in the Array) along with the eight bits of data. The error detection bit(s) would specify that, when reading from the eight memory cells, there should be five "0's" (and, by implication, three "1's"). If there are not five "0's", the data is presumed to have been corrupted (such as by a disturb mechanism), and corrective measures may be taken to attempt to obtain "valid" data, such as moving the read reference (RD). Regarding the number of "1s", which is three, this is easily derived (or inferred) from the total number of bits less the bits which are (or are supposed to be) "0s". The ED counter counts the data read from the Array.

FIG. 3B illustrates a next step in the process of programming with recovery.

The bits (0,2,3,4,7) are programmed from the SRAM to the Array. It should be understood that the bits do not move from the SRAM to the Array. Rather, the SRAM, loaded with User Data, serves as a "guide" or "template" for controlling the operation of associated circuitry (such as drivers providing voltages on selected bitlines and wordlines) programming the Array, based on the content of the SRAM bits.

Generally, programming involves increasing the Vt of selected ones (a subset) of the memory cells, thereby changing their program level (such as from 1 to 0). Programming may be performed using one or more (a series of) pulse(s), and after each pulse checking (reading) the Vt of the cell being programmed to see if it has been increased over PV. For example, a large (coarse) pulse, followed by a few smaller pulses for "fine tuning" the Vt.

In theory (on paper), everything flows smoothly, and the five cells (or half cells) corresponding to SRAM bits 0,2,3,4,7 will be programmed with a Vt which is above PV. However, in the real world of flash memory, things tend not to proceed so smoothly and predictably.

FIG. 3B illustrates that a number of cells are in a program distribution 304', which is supposed to be above PV. (Compare 304, FIG. 3A). In this example, some of the cells (or half cells) are successfully programmed to have Vts which passing (exceed) PV—these are the cells in the potion of the distribution "0" which are above (shown to the right of) PV. Other of the cells (or half cells) fail to be successfully programmed, and have Vts which are lower than (shown to the left of) PV.

In this example, the Array cells associated with SRAM bits 0,3,4 pass (exceed, are above) PV, and the Array cells associated with SRAM bits 2,7 fail to pass (are below) PV. Note that after a few programming pulses, if a cell fails to pass PV, programming of that cells stops and a "program fail" may be declared. (A program fail may be declared when there are any 0s left in SRAM after a timeout period, such as 1 ms (millisecond).)

It may (incidentally) be noted that the erase distribution ("1") 302' became narrower, from FIG. 3A to FIG. 3B. This simply illustrates that in FIG. 3A, all the memory cells in a given erase block were erased ("1"), and in FIG. 3B, only some of the memory cells in the erase block are erased ("1") and the remainder of the cells in the erase block are now programmed ("0"). In other words, generally, the total number of cells at levels 304' and 302' equal the number of cells at levels 302 (all, erased) and 304 (none).

In principle, even though the cells 2,7 were not successfully programmed, they can still be accurately read, since they have a Vt which is above RD. However, successful programming depends on more than simply being able to read the data which were programmed.

Here is where an understanding of what goes on during programming, in the SRAM, is important. Initially, as in TABLE 1, the SRAM contains a copy of the user data. But, as programming progresses, the contents of the SRAM changes. And, if programming fails, the data is no longer residing in SRAM, may not be readable from the Array, and needs to be recovered.

Continuing the previous example, during programming, the cells that are associated with SRAM bits 0,3,4—in other words, the cells that pass PV—are marked in the SRAM as '1'. Their value has been "flipped" from '0' (to be programmed), to '1' (successfully programmed). This ('1') is indicative that no more programming of those cells is needed, they have successfully been programmed. (The circuitry doing the programming treats a '1' as "do not program".)

The cells associated with SRAM bits 2,7—in other words, the cells that fail programming (did not pass PV), are left (remain) marked in the SRAM as "0". This is representative of User Data which was not successfully programmed into the Array.

The following table (TABLE 2) illustrates the altered (changed, updated) contents of the SRAM. Note that the bits 0,3,4 have changed (flipped) from '0' (see TABLE 1) to '1', and are now different than the original user data (TABLE 1). Notice in TABLE 2 that the SRAM bits 2,7 remain '0' (which is the same as the original user data (TABLE 1).

In other words, whereas TABLE 1 showed the SRAM containing the original user data, TABLE 2 shows the SRAM containing a reference '1' indicating that a cell (or half cell) was either initially erased (no programming required) or was successfully programmed, these two different conditions being indistinguishable at this point, and another reference '0' which indicates that a cell (or half cell) was supposed to be programmed to "0" and was not successfully programmed.

TABLE 2

(SRAM Contents)

| Address | 7 | 6 | 5 | 4 | 3 | 2 | 1 | 0 |
|---------|---|---|---|---|---|---|---|---|
| Content | '0' | '1' | '1' | '1' | '1' | '0' | '1' | '1' |

User Bits which were '1' remain as '1'
Bits which passed PV are marked as '1' (bold)
The remaining '0' bits did not pass PV Generally, although Array bits 0 through 7 may still be readable, since all of the "0" bits are above RD (see FIG. 6B), in some circumstances they may not be readable. And, the original user data is no longer available in SRAM. Thus, it is desirable that this original user data can be "recovered", or restored.

Bits that passed the PV level have been switched (flipped) from '0' to '1' in the SRAM, and in this example are assumed to be above the RD level. See TABLE 2, above.

Performing the Recovery (for "Basic")

Read failed data from the Array, into SRAM, as follows.
In case the bit in the SRAM is '0' (failed program), don't change it. Compare step 610 (*b*) in FIG. 6
In case the bit in the SRAM is '1' (was either initially "erase", or passed program), write the data from the Array into the SRAM. (Read the data from the Array and write it into SRAM). Compare step 610 (*c*) in FIG. 6

In the example, bits 2 and 7 in the SRAM are '0', they didn't change, they remain '0' and represent the User Data. So, nothing needs to be done, either to the SRAM bits 2,7 or with the Array bits corresponding to SRAM bits 2,7.

In this example, the SRAM bits 0,1,3,4,5,6 are all '1', and the Array bits associated with these SRAM bits may be read from the Array and written to the SRAM. Array bits 1,5,6 will be read as '1, and written as '1' to the SRAM. Array bits 0,3,4 will be read as '0', and written as '0' to the SRAM. (An alternative method would be to check if the bit in the SRAM is '1' and instead of writing all of those Array addresses to SRAM, to write only the '0s' read from the Array.)

In the example, Array bits 0,3,4 are above RD level, and are read as '0' from the Array, and written as '0' in to the SRAM. Array bits 1,5,6 are below RD, and may be written as '1' into the SRAM.

As shown in the following table (TABLE 3), the User Data has successfully been recovered, and is a combination of
SRAM data (bits 2,7) which were in the SRAM as User Data and were not flipped (they were not successfully programmed, so they remained as '0s')
Array data (bits 0,3,4) which were changed in the SRAM during programming (they were successfully programmed); and
Array data or SRAM data (1,5,6) which were in the SRAM as User Data corresponding to the erase state ("1")

TABLE 3

SRAM, with Recovered Data

| Address | 7 | 6 | 5 | 4 | 3 | 2 | 1 | 0 |
|---------|---|---|---|---|---|---|---|---|
| Content | '0' | '1' | '1' | '0' | '0' | '0' | '1' | '0' |

In the example given above, the original user data is now accurately represented in the SRAM, it has successfully been "recovered" (reconstructed, restored, recreated) into the SRAM. Recall that the SRAM contents during programming (TABLE 2), was not the same as the user data (TABLE 1). Now, the SRAM contents (TABLE 3) are the same as the user data (TABLE 1), and further actions may be taken, such as programming to another location in the Array.

"Performing Recovery with ED Mechanism"

The following describes a technique for performing recovery, when there has been a Vt shift in the NVM cells containing data, and the Vt shift is sufficient that the read reference (RD) needs to be moved, such as by using ED or ECC. See the flowchart of FIG. 7, which illustrates the "Recovery with ED Mechanism" flow 700.

In this example, some of the bits at program level "0" will not be accurately readable, because their Vt has fallen below RD (for example, due to a disturb mechanism). See FIG. 4C.

In this example a solution with ED is demonstrated, but any ECC algorithm can be applied instead, or a combination of the two (ED and/or ECC) may also be applied.

The algorithm (technique) assumes that there is still a gap or a "window" between the two distributions and using the ED mechanism (moving read reference) to shift the read reference (RD) will result with correct data.

Generally, the following steps may be performed, during a programming operation:

Step 1. An SRAM holds (is loaded with) the user data to be programmed. Bits which need to be programmed may be marked with '0' in the SRAM. A relevant portion of the array, such as an erase sector or block, is initially all erased (all bits are "1"). Bits which need not be programmed may be marked with '1' in the SRAM. See, for example, SRAM 162 in FIG. 1C. See steps 702 and 704 in FIG. 7.

Step 2. The user data is programmed from the SRAM to the Array. Bits which are successfully programmed (passed PV level in the Array) are changed to (marked as) '1' in the SRAM. See step 706 in FIG. 7.

Note, in Step 2, some of the SRAM bits are originally '1', indicating "do not program". After a '0' SRAM bit is successfully programmed, its value is "flipped" to a '1', which will indicate "stop programming" (which is analogous to "do not program"). A flipped SRAM bit is a successfully programmed bit, but is now indistinguishable from an SRAM bit which did not require programming in the first place. Thus, during (and after) programming, in the SRAM, '1' becomes ambiguous.

Step 3. If programming is successful, exit. See step 708 in FIG. 7. In case the program operation fails, the SRAM holds all the "failed" bits (bits that didn't pass the PV level in the Array), these bits remain marked as '0' in the SRAM. (Program fail can be inferred from the fact that there is at least one '0' in the SRAM, at the end of programming, or at the end of a timeout.)

It may be noted that Steps (1), (2) and (3) in the "Recovery with ED Mechanism" flow may be essentially identical to Steps (1), (2) and (3) of the "Basic" Recovery flow (discussed above).

Step 4. Recovery flow is performed. See step 710 in FIG. 7.

Figure 2C:
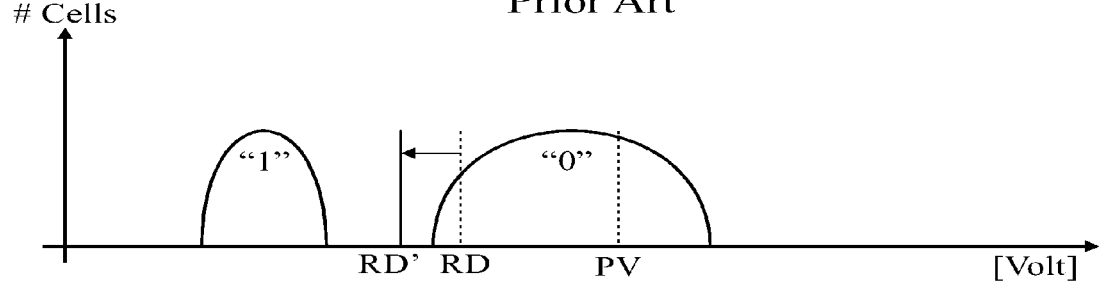
FIG. 2C is a diagram of threshold voltage (Vt) distributions of NVM cells in an array, illustrating the principle of "moving read reference", according to the prior art.

In contrast with the "Basic" Recovery flow (discussed above), here the flow is adapted to handle Array bits which may or may not have been successfully programmed (to "0"), passing PV, but subsequently lost some Vt and dropped not only below the PV level, but even further so as to be below the RD level, and "unreadable" (they will not be read as '0' based on having a Vt which is above RD). (See FIG. 2C, which illustrates some of the "0" distribution having shifted below RD.)

Additionally, in contrast with the "Basic" Recovery flow (discussed above), in this process of Performing Recovery with ED or ECC, two SRAMs (SRAM-1 and SRAM-2), or two different portions of one SRAM may be used. Generally, SRAM-1 used in Performing Recovery with ED or ECC is essentially the same as the single SRAM in the previous example of the "Basic" recovery flow (discussed above).

The steps for recovery may be performed, as follows.

a. Copy the data from the SRAM (hereinafter referred to as SRAM-1) into another SRAM (hereinafter referred to as SRAM-2). Recall that some of the data was flipped in Step 2, so the SRAM no longer contains the original user data.)

b. The failed data (such as an entire page of data) are read from the Array. (All of the data which was unsuccessfully programmed is read.)

c. In case the bit in SRAM-1 is '0' don't change it d. In case the bit in SRAM-1 is '1', write the data from the Array into SRAM-1 e. Using the ED mechanism, compare the number of zeros and ones which are read from the Array (and are now in the SRAM-1) to the ED counter (or ED bits stored along with the data in the Array), f. In case the ED counter is not aligned to (does not agree with) the number of zeros and ones in SRAM-1, a read error is assumed, and proceed to step g. (Else, if the ED counter is aligned, exit). (Here it can be noted that normally the ED counter is compared with the Array, but in the recovery technique described herein, the ED counter is compared with the contents of SRAM. In case the data in the SRAM aligns with the ED, no further steps are required to restore the data. Else, step "g".)

g. Move the RD reference level according to the ED decision, and proceed to step "h".

h. Copy the data from SRAM-2 into SRAM-1, and return to (b) until the data is recovered successfully (aligned with the ED counter), or a "time out" occurs. (Recall that SRAM-2 contains data which is not the original user data, but rather the user data with some of the bits flipped due to successful programming.)

It may be noted that the steps 710 (b), (c) and (d) in this "Recovery with ED Mechanism" flow 700 are essentially the same as the steps 610 (a), (b) and (c) of the "Basic" recovery flow 600 (discussed above).

In the step "e", the ED mechanism comes into play. In the step "f", if the data is not aligned with ED, you essentially start over. It may occur, for example, that the RD level will be below the erase bits, and bits which are '1' will be read as '0' from the Array. In case you didn't save the SRAM in a different SRAM, you won't be able to recover the data. In case the RD level is only above the program bits (as in FIG. 2C), you don't need the extra SRAM because you only add "legal" zeros. In this case, the RD level can be moved into the erase direction, and the algorithm can continue on the same SRAM.

Step 5. SRAM-1 now has (is filled with) the recovered User Data, and another attempt at programming (or other action) may be made. This step 5 is essentially the same as step (5) of the "Basic" recovery flow (discussed above). However, neither of the steps 5 are a process "step", but rather simply an end (final) result of the previous steps (1)-(4).

An Example of "Performing Recovery with ED Mechanism"

The following describes the a process of programming, with recovery of bits that were not successfully programmed, using ED and/or ECC. The following example assumes the fail is in the data bits and not in the ED bits.

Figure 4A:
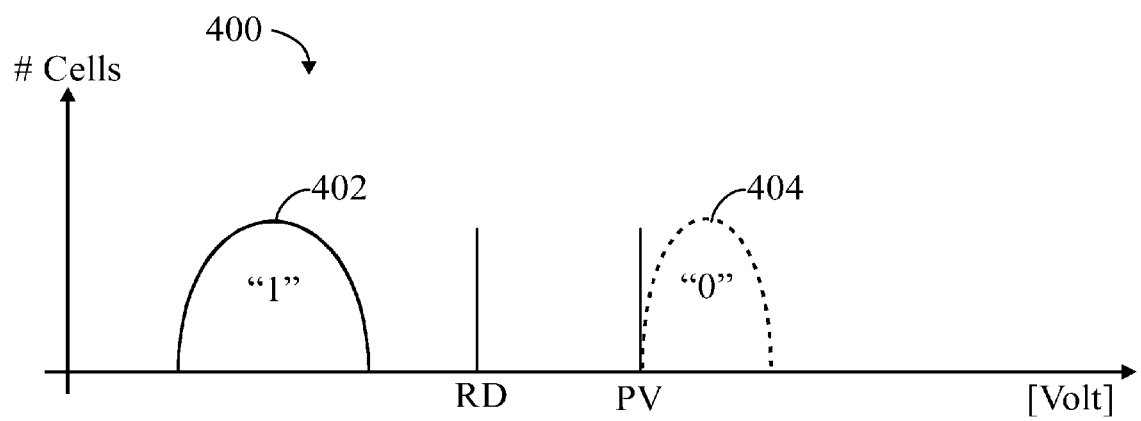
FIG. 4A is a diagram of threshold voltage (Vt) distributions of NVM cells in an array, illustrating the principle of "moving read reference", according to the disclosure.

FIG. 4A shows program initial condition, with two distributions "1" and "0", and RD and PV levels between the two distributions, as shown. This shows a "program initial condition". A distribution 402 is for memory cells which are erased, at program level ("1"). Initially, all of the memory cells are erased. A distribution 404 is for programmed memory cells, although none have been programmed yet. There is a gap between the distribution 402 and the distribution 404. A read value (RD) voltage is shown to the right of the distribution 402 and to the left of the distribution 404. A program verify (PV) voltage is shown to the right of the RD voltage. Compare FIG. 3A.

The following table (TABLE 4) illustrates the contents of a first SRAM ("SRAM-1"), having eight addresses (0 . . . 7) for holding (storing/buffering) eight binary values which are either binary '1' or binary '0'. SRAM-1 is loaded with User Data. This example shows eight SRAM bits loaded with eight bits of User Data. SRAM-1 bits 1, 5 and 6 are marked as '1', and need not be programmed. SRAM-1 bits 0, 2, 3, 4 and 7 are marked as '0', and correspond to Array cells (or half cells) that need to be programmed. Compare TABLE 1.

TABLE 4

| SRAM-1, with User Data | | | | | | | | |
|---|---|---|---|---|---|---|---|---|
| Address | 7 | 6 | 5 | 4 | 3 | 2 | 1 | 0 |
| Content | '0' | '1' | '1' | '0' | '0' | '0' | '1' | '0' |

Figure 4B:
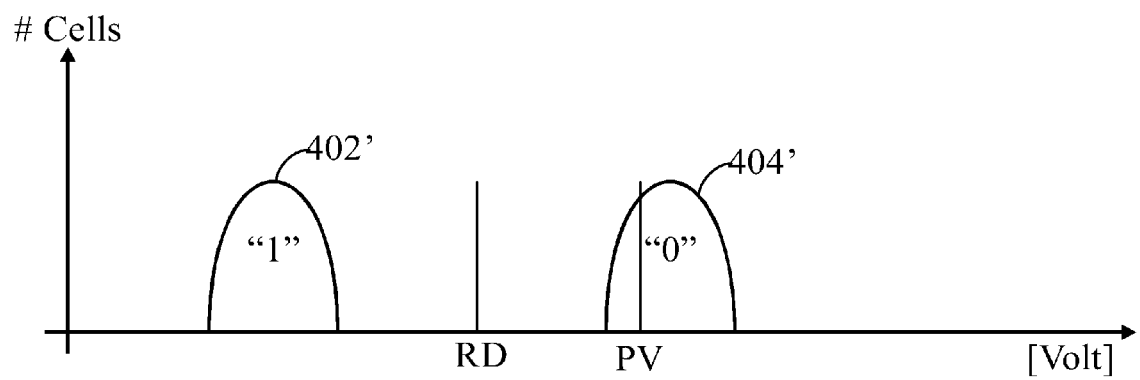
FIG. 4B is a diagram of threshold voltage (Vt) distributions of NVM cells in an array, illustrating the principle of "moving read reference", according to the disclosure.

FIG. 4B illustrates programming the bits from SRAM-1 to the Array. The erase distribution 402' (prime) becomes narrower, because some of the erased cells are now programmed. And there is a distribution 404' (prime) of cells at program level "0". Compare FIG. 3B.

Bits 0,2,3,4,7 are marked in SRAM-1 for programming, but only bits 0,3,4 passed the PV level, and are therefore marked as "1" in SRAM-1. The following table (TABLE 5) illustrates the altered contents of SRAM-1. Note that the bits 0,3,4 have changed from '0' (see TABLE 4) to '1'. The bits 2,7 in SRAM-1 are still '0'. SRAM-1 is now no longer representative of the user data. Compare TABLE 2. And, some of the "0" bits in the array are below PV.

TABLE 5

| (SRAM Contents) | | | | | | | | |
|---|---|---|---|---|---|---|---|---|
| Address | 7 | 6 | 5 | 4 | 3 | 2 | 1 | 0 |
| Content | '0' | '1' | '1' | '1' | '1' | '0' | '1' | '1' |

User Bits which were '1' remain as '1'
Bits which passed PV are marked as '1' (bold)
The remaining '0' bits did not pass PV Up to this point, the example of Performing Recovery with ED or ECC is essentially the same as (and may be identical with) the example of Basic Programming with Recovery.

Referring to FIG. 4B, it can be seen that some of the cells are erased ("1"), the remainder of the cells are at program level "0" (no change in Array), and some of the cells at program level "0" have a Vt below PV, but the Vt of all of the cells at program level "0" are above RD.

As illustrated by the following tables (TABLEs 6 and 7, below), prior to performing recovery, the contents of SRAM-1 are copied to SRAM-2. SRAM-2 may be another SRAM, or a portion of a single SRAM which is divided into portions designated SRAM-1 and SRAM-2.

Whereas SRAM-1 may typically be block size (such as 128 KB), SRAM-2 may be "chunk size" (such as 256 byte). Generally, SRAM-1 may be page size and SRAM-2 may be chunk size. When working with the ED, you may be working with chunk size which is less than page size. The recovery algorithm may thus be performed on chunk size. So when you are referring to SRAM-1 in this algorithm, the meaning is that you refer only to a chunk from SRAM-1. SRAM-2 may hold only one chunk at a time from SRAM-1.

TABLE 6

| SRAM-1 | | | | | | | | |
|---|---|---|---|---|---|---|---|---|
| Address | 7 | 6 | 5 | 4 | 3 | 2 | 1 | 0 |
| Content | '0' | '1' | '1' | '1' | '1' | '0' | '1' | '1' |

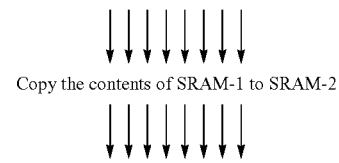

Copy the contents of SRAM-1 to SRAM-2

TABLE 7

| SRAM-2 | | | | | | | | |
|---|---|---|---|---|---|---|---|---|
| Address | 7 | 6 | 5 | 4 | 3 | 2 | 1 | 0 |
| Content | '0' | '1' | '1' | '1' | '1' | '0' | '1' | '1' |

Figure 4C:
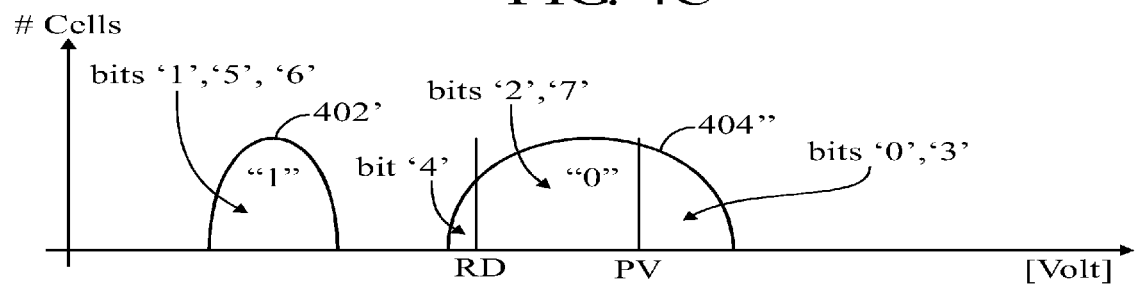
FIG. 4C is a diagram of threshold voltage (Vt) distributions of NVM cells in an array, illustrating the principle of "moving read reference", according to the disclosure.

FIG. 4C illustrates a condition of the Array cells, wherein some of the bits (cells) in the "0" distribution 704" (double prime) have dropped below the RD level.

Recall that bits 0,2,3,4,7 were User Data "0" (see TABLE 6). Bits 0,3,4 passed PV and were marked as '1' (see TABLE 5) for "stop programming". Bits 2,7 did not pass PV, and remain marked as '0' in SRAM-1. And the contents of SRAM-1 are copied to SRAM-2 (see TABLEs 6 and 7).

In this example, bit 4 has dropped below RD. Even though it initially passed PV, its PV may have slipped (dropped), due for example to a disturb condition. (Disturb of a cells contents may, for example, result from read or program operations occurring on neighboring cells.)

Note in FIG. 4C that the distribution at program level "0" is shown with exaggerated widening, for illustrative clarity. There are still the same number (five) of bits (bits 0,2,3,4,7) at program level "0" in FIG. 4C as there were in FIG. 4B.

Performing Recovery Flow will now be described. Reference is made to the following table (TABLE 8) which illustrates that:

In case the bit in the SRAM is '0' (failed program), don't change it.

In case the bit in the SRAM is '1' (was either initially "erase", or passed program), write the data from the Array into the SRAM. (Read the data from the Array and write it into SRAM).

In the example, bits 2 and 7 in the SRAM are '0', they didn't change, they remain '0' and represent the User Data. So, nothing needs to be done, either to the SRAM bits 2,7 or with the Array bits corresponding to SRAM bits 2,7.

In this example, the SRAM bits 0,1,3,4,5,6 are all '1', and the Array bits associated with these SRAM bits may be read from the Array and written to the SRAM. Array bits 1,5,6 will be read as '1', and written as '1' to the SRAM. Array bits 0,3,4 will be read as '0', and written as '0' to the SRAM. (An alternative method would be to check if the bit in the SRAM is '1' and instead of writing all of those Array addresses to SRAM, to write only the '0s' read from the Array.)

In the example, Array bits 0,3 but not bit '4' are above RD level, and are read as '0' from the Array, and written as '0' in to the SRAM. Array bits 1,5,6 are below RD, and may be written as '1' into the SRAM. Bit '4'looks like a '1', since it is below RD.

TABLE 8

| Address | 7 | 6 | 5 | 4 | 3 | 2 | 1 | 0 |
|---|---|---|---|---|---|---|---|---|
| Content | '0' | '1' | '1' | '1' | '1' | '0' | '1' | '1' |

TABLE 8 is essentially the same as TABLE 6, but bits 1,5,6 may have been re-written, or just left alone since they are already '1s'.

In this example, the bits 0,3 (of the Array) are above RD level and read as '0' from the Array. The following table (TABLE 9) shows that bits 0, 3 (bold) have changed from "1" to "0".

TABLE 9

| Address | 7 | 6 | 5 | 4 | 3 | 2 | 1 | 0 |
|---|---|---|---|---|---|---|---|---|
| Content | '0' | '1' | '1' | '1' | '0' | '0' | '1' | '0' |

At this point, SRAM-1 is not successfully recovered. In other words, the User Data has not successfully been recovered (reconstructed, restored). It is not accurately represented in SRAM-1, and therefore a further programming attempt would be futile. Note that bit 4 is "with error", it was supposed to be recovered to "0", but could not be because its Vt shifted to below RD.

Figure 4D:
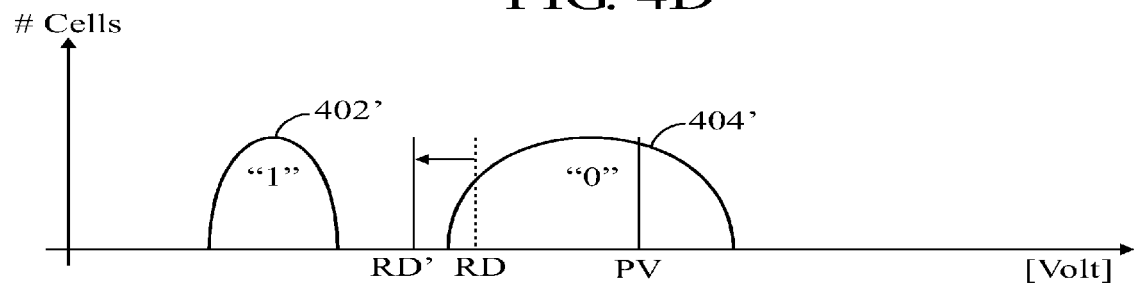
FIG. 4D is a diagram of threshold voltage (Vt) distributions of NVM cells in an array, illustrating the principle of "moving read reference", according to the disclosure.

FIG. 4D illustrates applying the ED mechanism. This generally involves moving the read reference (RD), to the left, now labeled RD' (prime), to "capture" the "0s" that have lost sufficient Vt to be below the initial RD value. (It may be assumed that the Vt of these cells is still above the "1" (erase) distribution.) This may be referred to as "moving read reference", and the concept is generally disclosed in the aforementioned U.S. Pat. Nos. 6,963,505 and 6,992,932. The read reference may be moved using ED bits, or an ECC technique, either of which may be referred to herein as the "ED mechanism".

When referring to using an "ED mechanism", it should be understood that any mechanism may be used to check the stored data (in this case, the data in SRAM-1, rather than the data in the Array) against an error detecting reference, and if it does not agree (align), move the read reference until it does. Thus, "ED mechanism" implies error detection and correction mechanism for cells that have shifted Vt sufficiently that there are problems reading the cells.

The recovered data is counted and compared to the ED counter. In the example, the ED mechanism will detect the error and shift the RD reference to the left.

This process of shifting the read reference and performing another read may continue, iteratively, until the ED counter aligns with the counted data (in SRAM-1), or a maximum number of read attempts is reached (and you stop trying).

The contents of SRAM-2 (TABLE 11) may be copied into SRAM-1 (TABLE 10), and re-read the failed data from the Array (step (b)). This corresponds to the step (h), mentioned above. All of the data may be read (not only bit 4), because you generally will not know which of the bits failed.

TABLE 10

| | SRAM-1 | | | | | | | |
|---|---|---|---|---|---|---|---|---|
| Address | 7 | 6 | 5 | 4 | 3 | 2 | 1 | 0 |
| Content | '0' | '1' | '1' | '1' | '1' | '0' | '1' | '1' |

Copy the contents of SRAM-2 to SRAM-1

TABLE 11

| | SRAM-2 | | | | | | | |
|---|---|---|---|---|---|---|---|---|
| Address | 7 | 6 | 5 | 4 | 3 | 2 | 1 | 0 |
| Content | '0' | '1' | '1' | '1' | '1' | '0' | '1' | '1' |

The contents of SRAM-2 are copied into SRAM-1 in order to recover the initial data at Sram1 (before the read). Now that you are at the initial point, the RD level is shifted to the correct location and read again from the Array. Because the RD is at correct location, the read will be successful, and the ED will be aligned to the read data.

Now the next read from the Array will detect bit 4 as "0", and the data will be recovered successfully. See the following table (TABLE 12). Compare TABLE 3.

TABLE 12

| | SRAM-1, with Recovered Data | | | | | | | |
|---|---|---|---|---|---|---|---|---|
| Address | 7 | 6 | 5 | 4 | 3 | 2 | 1 | 0 |
| Content | '0' | '1' | '1' | '0' | '0' | '0' | '1' | '0' |

Performing Recovery Using an ED Mechanism, in Case the ED Bits Fail

The previous flow and example assumed that the fail is in the data bits. In a practical situation the ED bits may also (and/or) fail. This issue can be solved, for example, with two options.

The first of the two options is to try to avoid the problem by storing the ED bits with more reliability (than the data bits), and assume when reading the ED bits, the ED bits are with no fail. For example, when the Array supports MLC, store the data bits using MLC (to maximize capacity) and store the ED bits using SLC (to maximize reliability). Or, for example, when using charge-trapping devices such as NROM, each device having two storage areas (left and right half cells), only use one of the two storage areas in each NROM (thereby sacrificing capacity for reliability). Or, for example, store ED bits using both SLC and using only one of two half cells.

In case the ED bits have the same reliability as the data bits and may fail in the Read, the ED bits should also be read again with the data.

The ED mechanism can be handled with the same type of fail ('0' who read as '1' or '1' who read as '0') in the ED and in the Data. In this case the ED decision will still be correct and the data can be recovered correctly.

The following describes the recovery flow in case the ED bits may also fail. This process flow 800 is illustrated in FIG. 8, and is nearly identical to the process flow 700 of FIG. 7.

Generally, the following steps may be performed, during a programming operation:

Step 1. An SRAM holds (is loaded with) the user data to be programmed. Bits which need to be programmed may be marked with '0' in the SRAM. A relevant portion of the array, such as an erase sector or block, is initially all erased (all bits are "1"). Bits which need not be programmed may be marked with '1' in the SRAM. See, for example, SRAM 162 in FIG. 1C. See steps 802 and 804 in FIG. 8.

Step 2. The user data is programmed from the SRAM to the Array. Bits which are successfully programmed (passed PV level in the Array) are changed to (marked as) '1' in the SRAM. See step 806 in FIG. 8.

Note, in Step 2, some of the SRAM bits are originally '1', indicating "do not program". After a '0' SRAM bit is successfully programmed, its value is "flipped" to a '1', which will indicate "stop programming" (which is analogous to "do not program"). A flipped SRAM bit is a successfully programmed bit, but is now indistinguishable from an SRAM bit which did not require programming in the first place. Thus, during (and after) programming, in the SRAM, '1' becomes ambiguous.

Step 3. If programming is successful, exit. See step 808 in FIG. 8. In case the program operation fails, the SRAM holds all the "failed" bits (bits that didn't pass the PV level in the Array), these bits remain marked as '0' in the SRAM. (Program fail can be inferred from the fact that there is at least one '0' in the SRAM, at the end of programming, or at the end of a timeout.)

Step 4. Recovery flow is performed. See step 810 in FIG. 8.

In contrast with the "Basic" Recovery flow (discussed above), here the flow is adapted to handle Array bits which may or may not have been successfully programmed (to "0"), passing PV, but subsequently lost some Vt and dropped not only below the PV level, but even further so as to be below the RD level, and "unreadable" (they will not be read as '0' based on having a Vt which is above RD). (See FIG. 2C, which illustrates some of the "0" distribution having shifted below RD.)

Additionally, in contrast with the "Basic" Recovery flow (discussed above), in this process of Performing Recovery with ED or ECC, two SRAMs (SRAM-1 and SRAM-2), or two different portions of one SRAM may be used. Generally, SRAM-1 used in Performing Recovery with ED or ECC is essentially the same as the single SRAM in the previous example of the "Basic" recovery flow (discussed above).

The steps for recovery may be performed, as follows.

a. Copy the data from the SRAM (SRAM-1) into another SRAM (SRAM-2). Also copy the ED bits into SRAM-2.

b. The failed data (such as an entire page of data) are read from the Array. (All of the data which was unsuccessfully programmed is read.)

c. In case the bit in SRAM-1 is '0' don't change it d. In case the bit in SRAM-1 is '1', write the data from the Array into SRAM-1 e. Using the ED mechanism, compare the number of zeros and ones which are read from the Array (and are now in the SRAM-1) to the ED counter (or ED bits stored along with the data in the Array), f. In case the ED counter is not aligned to (does not agree with) the number of zeros and ones in SRAM-1, a read error is assumed, and proceed to step g. (Else, if the ED counter is aligned, exit). (Here it can be noted that normally the ED counter is compared with the Array, but in the recovery technique described herein, the ED counter is compared with the contents of SRAM. In case the data in the SRAM aligns with the ED, no further steps are required to restore the data. Else, step "g".)

g. Move the RD reference level according to the ED decision, and proceed to step "h".

h. Copy the data from SRAM-2 into SRAM-1, and return to (b) until the data is recovered successfully (aligned with the ED counter), or a "time out" occurs. (Recall that SRAM-2 contains data which is not the original user data, but rather the user data with some of the bits flipped due to successful programming.)

In the step "e", the ED mechanism comes into play. In the step "f", if the data is not aligned with ED, you essentially start over. It may occur, for example, that the RD level will be below the erase bits, and bits which are '1' will be read as '0' from the Array. In case you didn't save the SRAM in a different SRAM, you won't be able to recover the data. In case the RD level is only above the program bits (as in FIG. 2C), you don't need the extra SRAM because you only add "legal" zeros. In this case, the RD level can be moved into the erase direction, and the algorithm can continue on the same SRAM.

Step 5. SRAM-1 now has (is filled with) the recovered User Data, and another attempt at programming (or other action) may be made. This step 5 is essentially the same as step (5) of the "Basic" recovery flow (discussed above). However, neither of the steps 5 are a process "step", but rather simply an end (final) result of the previous steps (1)-(4).

Performing Recovery with ED and/or ECC, MLC Compared to SLC

Figure 5:
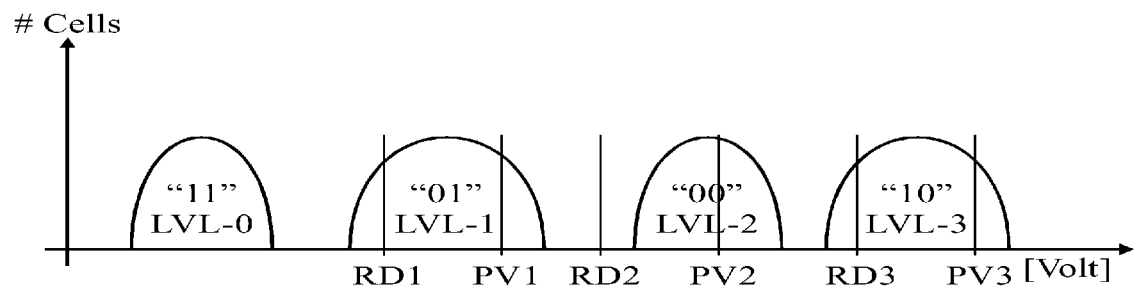
FIG. 5 is a diagram of threshold voltage (Vt) distributions of NVM cells in an array, illustrating the principle of "moving read reference", according to the disclosure.

Basically performing recovery with ED mechanism for multilevel cells (MLC) is very similar to performing recovery with ED mechanism for single level cells (SLC)s, as described above. However, in case the chip is MLC type, the ED may be kept for every distribution separately, FIG. 5 (compare FIG. 2B) shows MLC type chip with 4 distributions. The figure shows a case were the data is going to be recovered but LVLI and LVL3 failed below their read reference levels RD1 and RD3 respectively. In this case the ED mechanism will decide to shift references RD1 and RD3 to the left.

In the MLC case as in the SLC case, the algorithm assumes there is still a gap or a "window" between the distributions and shifting the reference to the correct direction will result in correct data being recovered.

If there is no gap between distributions, some of the lower Vt bits from one distribution may be approximately the same as some of higher Vt bits from a lower distribution. This condition is termed "overlap", and ECC mechanisms may exist, and be incorporated with the teachings set forth herein to recover data in the case of overlap.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A method of programming a set of erased non-volatile memory (NVM) cells comprising:

loading data to be programmed to the NVM cells onto a first set of Static Random Memory (SRAM) bits, wherein each of one or more SRAM bits corresponds to an NVM cell;

flipping each of the one or more SRAM bits corresponding to a given NVM cell once the given NVM cell has been program verified;

copying data back from each of the program verified NVM cells to respective corresponding one or more SRAM bits of the first set in the event an NVM cell cannot be program verified, wherein copying data back includes reading the NVM cells using a first read reference level; and performing error detection on the bits of the SRAM once copying has been completed.

2. The method according to claim 1, further comprising, prior to copying data back from each of the program verified NVM cells to respective corresponding one or more SRAM bits, copying data from the first SRAM to a second SRAM.

3. The method according to claim 2, wherein upon detection of an error on the first SRAM occurring: (1) copying data from the second SRAM set back to the first SRAM set, and (2) copying data back from each of the program verified NVM cells to respective corresponding one or more SRAM bits of the first set using a second read reference level.

4. The method according to claim 2, wherein copying data from the first set of SRAM to the second set of SRAM includes copying the error detection bits.

5. The method according to claim 2, wherein at least one of the SRAM sets is used for cache programming.

6. The method of claim 2, wherein the second set of SRAM cells is smaller than the first set.

7. A non-volatile memory (NVM) device comprising:
a set of non-volatile memory (NVM) cells;
control logic adapted to: (1) load data to be programmed to the NVM cells onto a first set of Static Random Memory (SRAM) bits, wherein each of one or more SRAM bits corresponds to an NVM cell; (2) flip each of the one or more SRAM bits corresponding to a given NVM cell once the given NVM cell has been program verified; (3) copy data back from each of the program verified NVM cells to respective corresponding one or more SRAM bits of the first set in the event an NVM cell cannot be program verified, wherein copying data back includes reading the NVM cells using a first read reference level; and (4) performing error detection on the bits of the SRAM once copying has been completed.

8. The device according to claim 7, wherein said control logic if further adapted to, prior to copying data back from each of the program verified NVM cells to respective corresponding one or more SRAM bits, copy data from the first SRAM to a second SRAM.

9. The device according to claim 8, wherein said control logic is further adapted to, upon detection of an error on the first SRAM occurring: (1) copy data from the second SRAM set back to the first SRAM set, and (2) copy data back from each of the program verified NVM cells to respective corresponding one or more SRAM bits of the first set using a second read reference level.

10. The device according to claim 8, wherein said control logic is adapted to copy data from the first set of SRAM to the second set of SRAM including the error detection bits.

11. The device according to claim 8, wherein at least one of the SRAM sets is used for cache programming.

12. The device according to claim 8, wherein the second set of SRAM cells is smaller than the first set.

* * * * *